United States Patent
Kuramochi

(10) Patent No.: US 8,384,450 B2
(45) Date of Patent: Feb. 26, 2013

(54) FREQUENCY SYNTHESIZER DEVICE AND MODULATION FREQUENCY DISPLACEMENT ADJUSTMENT METHOD

(75) Inventor: Takashi Kuramochi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/179,666

(22) Filed: Jul. 11, 2011

(65) Prior Publication Data

US 2012/0013375 A1 Jan. 19, 2012

(30) Foreign Application Priority Data

Jul. 15, 2010 (JP) ................................. 2010-160912

(51) Int. Cl.
*H03L 7/06* (2006.01)
(52) U.S. Cl. ........................................ 327/156; 327/147
(58) Field of Classification Search .................. 327/147, 327/156
See application file for complete search history.

(56) References Cited

U.S. PATENT DOCUMENTS

| | | | |
|---|---|---|---|
| 7,012,470 B2* | 3/2006 | Suzuki et al. .................... 331/16 |
| 7,170,356 B2* | 1/2007 | Korner ....................... 331/117 R |
| 7,893,782 B2* | 2/2011 | Hosoya et al. ........... 331/117 FE |
| 2003/0060177 A1* | 3/2003 | Noboru et al. ................ 455/260 |
| 2004/0189403 A1* | 9/2004 | Suzuki et al. .................... 331/16 |
| 2005/0206460 A1* | 9/2005 | Korner ......................... 331/36 C |
| 2007/0111675 A1* | 5/2007 | Arayashiki et al. ............. 455/78 |
| 2009/0322436 A1* | 12/2009 | Hosoya et al. ........... 331/117 FE |
| 2012/0013375 A1* | 1/2012 | Kuramochi ................... 327/156 |

FOREIGN PATENT DOCUMENTS

JP 02-100519 4/1990

* cited by examiner

*Primary Examiner* — Adam Houston
(74) *Attorney, Agent, or Firm* — Volentine & Whitt, PLLC

(57) ABSTRACT

A frequency synthesizer device that includes two modulation paths and suitably adjusts the amplitude of a control voltage that is outputted from a digital-to-analog converter (DAC) to a voltage-controlled oscillator. The frequency synthesizer device is provided with a voltage-controlled oscillator, a programmable frequency divider, a frequency phase comparator, a DAC, a switch and a modulation frequency displacement correction circuit. The voltage-controlled oscillator oscillates at an oscillation frequency depending on an input voltage. The programmable frequency divider frequency-divides a signal from the voltage-controlled oscillator. The frequency phase comparator outputs a phase difference between the frequency-divided signal and a reference clock. The DAC outputs an adjustment voltage. The switch connects the voltage-controlled oscillator to a reference voltage power source at a time of correction of the adjustment voltage. The modulation frequency displacement correction circuit specifies adjustment data that corresponds to the adjustment voltage corresponding to the target frequency displacement.

19 Claims, 17 Drawing Sheets

FREQUENCY SYNTHESIZER DEVICE AND MODULATION FREQUENCY DISPLACEMENT ADJUSTMENT METHOD

CROSS-REFERENCE TO RELATED APPLICATION

This application is based on and claims priority under 35 USC 119 from Japanese Patent Application No. 2010-160912 filed on Jul. 15, 2010, the disclosure of which is incorporated by reference herein.

BACKGROUND

1. Technical Field

The present invention relates to a frequency synthesizer device and a modulation frequency displacement adjustment method.

2. Related Art

Heretofore, a frequency synthesizer that uses a phase lock loop (PLL) circuit has been known. For example, in FIG. 9 of Japanese Patent Application Laid-Open (JP-A) No. 2-100519, a two-level frequency modulator is disclosed in which a frequency synthesizer and a digital-to-analog converter (DAC) are combined. The frequency synthesizer utilizes a PLL circuit, and, at times of frequency switching, the DAC applies a control voltage from outside the PLL circuit to a voltage-controlled oscillator.

A fractional-N frequency synthesizer is known as a frequency synthesizer that may control frequency with high precision. This synthesizer equivalently sets frequency division ratios to non-integer values using delta-sigma modulation or the like, and may vary an oscillation frequency continuously. A frequency synthesizer device 100 as illustrated in FIG. 17 has been known heretofore. The frequency synthesizer device 100 uses a fractional-N frequency synthesizer for a two-level frequency modulator. With this frequency synthesizer device 100, transmission data may be modulated by frequency shift keying (FSK) and transmitted.

As illustrated in FIG. 17, the frequency synthesizer device 100 includes a fractional-N frequency synthesizer 11, a digital-to-analog converter (DAC) 12, a voltage-controlled oscillator 14 and an adder 16.

The fractional-N frequency synthesizer 11 includes a delta-sigma modulator 18, a programmable frequency divider 20, a frequency phase comparator 22 and a loop filter 24.

Transmission data is inputted to the adder 16 and the DAC 12. The adder 16 inputs the transmission data and channel frequency setting data, which is data that corresponds to an oscillation frequency at which the voltage-controlled oscillator 14 is to oscillate (a carrier frequency).

The adder 16 adds the inputted transmission data and frequency setting data and outputs added data to the delta-sigma modulator 18.

The delta-sigma modulator 18 applies delta-sigma modulation to the inputted added data, and outputs the result to the programmable frequency divider 20 to serve as a frequency division ratio setting signal.

At the programmable frequency divider 20, the signal outputted from the voltage-controlled oscillator 14 is frequency-divided by the frequency division ratio specified by the frequency division ratio setting signal outputted from the delta-sigma modulator 18, and the frequency-divided signal is outputted to the frequency phase comparator 22.

The frequency phase comparator 22 compares the phases of an inputted reference clock and the frequency-divided signal outputted from the programmable frequency divider 20, and outputs a phase difference signal corresponding to the phase difference to the loop filter 24. The loop filter 24 applies smoothing processing to the inputted phase difference signal, and outputs the result to the voltage-controlled oscillator 14 to serve as a voltage control signal.

Meanwhile, the DAC 12 converts the inputted transmission data from digital to analog and outputs the analog signal to the voltage-controlled oscillator 14.

The voltage-controlled oscillator 14 oscillates at a frequency (a channel frequency) according to the voltage control signal inputted from the loop filter 24, and outputs a signal in which this frequency is FSK-modulated with the analog signal inputted from the DAC 12. For example, if a frequency displacement is $\Delta F$, when the transmission data inputted to the DAC 12 is a one, an FSK-modulated signal that is shifted by $+\Delta F$ from the channel frequency is outputted from the voltage-controlled oscillator 14, and when the transmission data inputted to the DAC 12 is a zero, an FSK-modulated signal that is shifted by $-\Delta F$ from the channel frequency is outputted from the voltage-controlled oscillator 14.

Now, if the transmission data were a signal with a waveform as illustrated in FIG. 18 (1), and the voltage-controlled oscillator 14 were controlled only by the DAC 12, the FSK-modulated signal outputted from the voltage-controlled oscillator 14 would have a waveform as illustrated in FIG. 18 (3). If the signal outputted from the voltage-controlled oscillator 14 were modulated by control of the DAC 12 alone, as illustrated in FIG. 18 (3), the transmission data would not be inputted to the fractional-N frequency synthesizer 11 and the oscillator frequency would go into a locked state. As a result, the FSK-modulated signal would have characteristics of a high-pass filter. On the other hand, if the signal outputted from the voltage-controlled oscillator 14 were modulated by control of the fractional-N frequency synthesizer 11 alone, the FSK-modulated signal outputted from the voltage-controlled oscillator 14 would have a waveform as illustrated in FIG. 18 (4). As illustrated in FIG. 18 (4), a signal that was FSK-modulated by control of the fractional-N frequency synthesizer 11 alone would have characteristics of a low-pass filter.

That is, with the fractional-N frequency synthesizer 11 alone, if the bit rate of the transmission data increased, tracking in the PLL might be lost. Accordingly, the DAC 12 is combined into a two-level frequency modulator as in the frequency synthesizer device 100 illustrated in FIG. 17, and hence a properly FSK-modulated signal as illustrated in FIG. 18 (2) is outputted from the voltage-controlled oscillator 14 even when the transmission data is at a high bit rate.

However, because the frequency synthesizer device 100 features two modulation paths, it is difficult to match up frequency displacements of the two modulation paths when adjusting the frequency. In a fractional-N frequency synthesizer, the frequency displacement is controlled with high precision. Therefore, there is a need to suitably adjust the amplitude of the control voltage that is inputted from the DAC 12 to the voltage-controlled oscillator 14, which is a direct modulation path.

SUMMARY

The present invention is proposed to solve the problem described above, and provides a frequency synthesizer device and a modulation frequency displacement adjustment method that may, in a frequency synthesizer device that includes two modulation paths, suitably adjust the amplitude of a control voltage that is outputted from a DAC to a voltage-controlled oscillator.

According to the first aspect of the invention, a frequency synthesizer device includes: a voltage-controlled oscillation unit that oscillates at an oscillation frequency in accordance with an inputted control voltage; a frequency division unit that frequency-divides an output signal from the voltage-controlled oscillation unit, a frequency division ratio thereof being variable on the basis of an inputted frequency setting signal; a frequency phase comparison unit that outputs a phase difference, between a frequency-divided signal that has been frequency-divided by the frequency division unit and a reference clock, to the voltage-controlled oscillation unit as the control voltage; an adjustment voltage output unit that outputs transmission data to the voltage-controlled oscillation unit and that outputs an adjustment voltage to the voltage-controlled oscillation unit when the oscillation frequency is to be displaced by an amount corresponding to a target frequency displacement in accordance with the transmission data; a switch that, at a time of correction of the adjustment voltage, switches from connecting between the voltage-controlled oscillation unit and the frequency phase comparison unit to connecting between the voltage-controlled oscillation unit and a reference voltage power source that supplies a pre-specified reference voltage; and a specification unit that, at the time of correction of the adjustment voltage, specifies adjustment data that corresponds to the adjustment voltage corresponding to the target frequency displacement, on the basis of a count value for which a frequency of the frequency-divided signal is counted in a state in which arbitrary transmission data is outputted to the adjustment voltage output unit and causes the voltage-controlled oscillation unit to oscillate.

According to the second aspect of the invention, the specification unit may specify the adjustment voltage corresponding to the target frequency displacement on the basis of a difference between two count values of a count value when a transmission data one is outputted to the adjustment voltage output unit, a count value when a transmission data zero is outputted to the adjustment voltage output unit, or count value when no transmission data is outputted to the adjustment voltage output unit and there is no modulation.

According to the third aspect of the invention, the specification unit may specify the adjustment voltage corresponding to the target frequency displacement on the basis of a difference between the count value when a transmission data one is outputted to the adjustment voltage output unit and the count value when a transmission data zero is outputted to the adjustment voltage output unit.

According to the fourth aspect of the invention, at the time of correction of the adjustment voltage, the specification unit starts a count of the frequency of the frequency-divided signal after a pre-specified frequency instability period has passed after the switch is connected to the reference voltage power source.

According to the fifth aspect of the invention, at the time of correction of the adjustment voltage, the specification unit may re-count the frequency if the count value is a value outside a pre-specified tolerance range.

According to the sixth aspect of the invention, the frequency division unit may include: a first frequency division unit that frequency-divides the output signal from the voltage-controlled oscillation unit with a pre-specified fixed frequency division ratio; and a second frequency division unit that frequency-divides the frequency-divided signal that has been frequency-divided by the first frequency division unit with a frequency division ratio based on the frequency setting signal and outputs an output signal to the frequency phase comparison unit, and the specification unit may count the frequency of the frequency-divided signal from the first frequency division unit.

According to the seventh aspect of the invention, the frequency division unit may include a first frequency division unit that frequency-divides the output signal from the voltage-controlled oscillation unit with a pre-specified fixed frequency division ratio, and a second frequency division unit that frequency-divides the frequency-divided signal that has been frequency-divided by the first frequency division unit with a frequency division ratio based on the frequency setting signal and outputs an output signal to the frequency phase comparison unit, and the specification unit may count the frequency of the frequency-divided signal from the second frequency division unit.

According to the eighth aspect of the invention, the specification unit may obtain an adjustment voltage that corresponds to a frequency displacement that is N times the target frequency displacement, and specifies an adjustment voltage of 1/N of the obtained adjustment voltage as the adjustment voltage corresponding to the target frequency displacement.

According to the ninth aspect of the invention, the specification unit may specify, for each bit of the adjustment data, a frequency count period for when specifying the each bit of the adjustment data, based on a weighting for frequency displacement of the each bit of the adjustment data.

According to the tenth aspect of the invention, the specification unit may specify the adjustment data on the basis of a weighting for frequency displacement of each bit of the adjustment data and a count value when pre-specified adjustment data is outputted to the adjustment voltage output unit and the frequency is counted.

According to the eleventh aspect of the invention, the voltage-controlled oscillation unit may include: two variable capacitance circuits that differ in voltage sensitivity; and a selection unit that, at the time of correction of the adjustment voltage, selects the variable capacitance circuit with the smaller voltage sensitivity from the two variable capacitance circuits and connects the selected variable capacitance circuit to the frequency phase comparison unit.

According to the twelfth aspect of the invention, the voltage-controlled oscillation unit may include: plural variable capacitance circuits connected in parallel; and a selection unit that, at the time of correction of the adjustment voltage, connects a variable capacitance circuit selected from the plurality of variable capacitance circuits to the adjustment voltage output unit.

According to the thirteenth aspect of the invention, respective capacitance values of the variable capacitance circuits are specified to be in ratios that are powers of two.

According to the fourteenth aspect of the invention, the specification unit, on the basis of the adjustment voltage specified for a pre-specified oscillation frequency, may specify an adjustment voltage for an oscillation frequency that differs from the pre-specified oscillation frequency.

According to the fifteenth aspect of the invention, a frequency displacement adjustment method includes: oscillating at an oscillation frequency in accordance with an inputted control voltage; frequency-dividing a signal oscillated at the oscillation frequency with a frequency division ratio that is variable on the basis of an inputted frequency setting signal; outputting a phase difference between a frequency-divided signal that has been frequency-divided and a reference clock to a voltage-controlled oscillation unit as the control voltage, the voltage-controlled oscillation unit oscillating at the oscillation frequency; outputting transmission data to the voltage-controlled oscillation unit, and outputting an adjustment voltage to the voltage-controlled oscillation unit when the oscillation frequency is to be displaced by an amount corresponding to a target frequency displacement in accordance with the transmission data; at a time of correction of the adjustment voltage, switching from connecting between the voltage-controlled oscillation unit and a frequency phase comparison unit, which compares the phases of the frequency-divided signal and the reference clock, to connecting between the voltage-controlled oscillation unit and a reference voltage power source that supplies a pre-specified reference voltage; and at the time of correction of the adjustment voltage, specifying adjustment data that corresponds to the adjustment voltage corresponding to the target frequency displacement, on the basis of a count value for a the frequency of the frequency-divided signal is counted in a state in which arbitrary transmission data is outputted to an adjustment voltage output unit, which outputs the adjustment voltage, and causes the voltage-controlled oscillation unit to oscillate.

According to the present invention, an excellent effect is provided in that, in a frequency synthesizer device that includes two modulation paths, the amplitude of a control voltage that is outputted from a DAC to a voltage-controlled oscillator may be suitably adjusted.

BRIEF DESCRIPTION OF THE DRAWINGS

Exemplary embodiments of the present invention will be described in detail based on the following figures, wherein.

DETAILED DESCRIPTION

Herebelow, preferred embodiments of the present invention are described in detail while referring to the attached drawings.

-First Embodiment-

Figure 1:
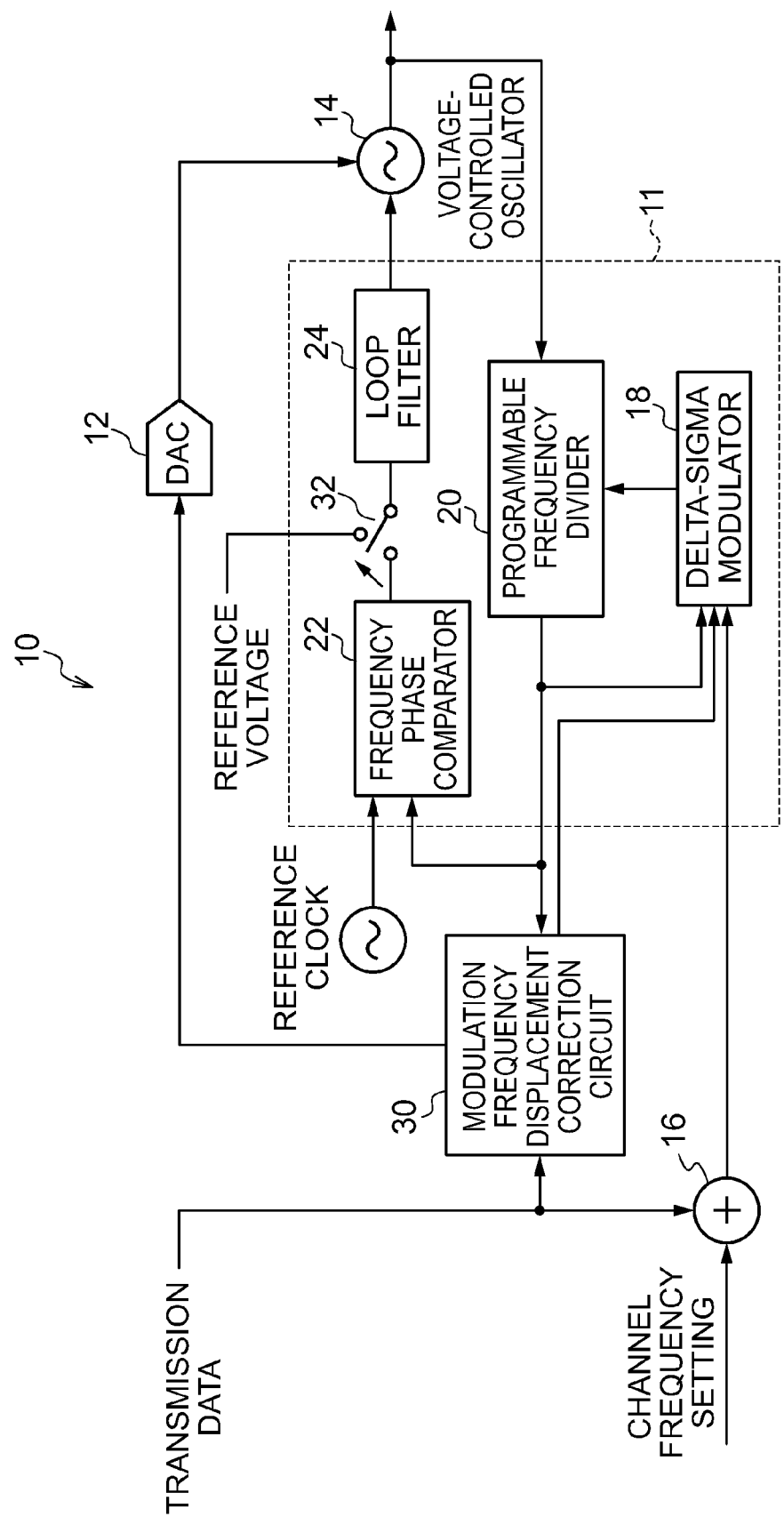
FIG. 1 is a structural diagram of a frequency synthesizer device relating to a first embodiment.

FIG. 1 illustrates structure of a frequency synthesizer device 10 relating to the first embodiment of the present invention.

As illustrated in FIG. 1, the frequency synthesizer device 10 includes the fractional-N frequency synthesizer 11, the DAC (digital-to-analog converter) 12, the voltage-controlled oscillator 14, the adder 16 and a modulation frequency displacement correction circuit 30.

The fractional-N frequency synthesizer 11 includes the delta-sigma modulator 18, the programmable frequency divider 20, the frequency phase comparator 22, the loop filter 24 and a switch 32.

Transmission data is inputted to the adder 16 and the DAC 12. The adder 16 inputs the transmission data and channel frequency setting data. The channel frequency setting data is data that corresponds to an oscillation frequency at which the voltage-controlled oscillator 14 is to oscillate (a carrier frequency).

The adder 16 adds the inputted transmission data and the frequency setting data, and outputs the added data to the delta-sigma modulator 18.

The delta-sigma modulator 18 applies delta-sigma modulation to the inputted added data, and outputs the result to the programmable frequency divider 20 as a frequency division ratio setting signal.

At the programmable frequency divider 20, the signal outputted from the voltage-controlled oscillator 14 is frequency-divided by the frequency division ratio specified by the frequency division ratio setting signal outputted from the delta-sigma modulator 18, and the frequency-divided signal is outputted to the frequency phase comparator 22 and the modulation frequency displacement correction circuit 30.

The frequency phase comparator 22 compares the phases of an inputted reference clock and the frequency-divided signal outputted from the programmable frequency divider 20, and outputs a phase difference signal according to the phase difference to the loop filter 24. The loop filter 24 applies smoothing processing to the inputted phase difference signal and outputs the result to the voltage-controlled oscillator 14 as a voltage control signal.

Meanwhile, the DAC 12 converts the inputted transmission data from digital to analog and outputs the analog signal to the voltage-controlled oscillator 14.

The voltage-controlled oscillator 14 oscillates at a frequency according to the voltage control signal inputted from the loop filter 24 (a channel frequency), and outputs a signal in which this frequency is FSK-modulated with the analog signal inputted from the DAC 12. For example, if a frequency displacement is to be $\Delta F$, when the transmission data inputted to the DAC 12 is a one, an FSK-modulated signal that is shifted by $+\Delta F$ from the channel frequency is outputted from the voltage-controlled oscillator 14, and when the transmission data inputted to the DAC 12 is a zero, an FSK-modulated signal that is shifted by $-\Delta F$ from the channel frequency is outputted from the voltage-controlled oscillator 14.

Figure 2:
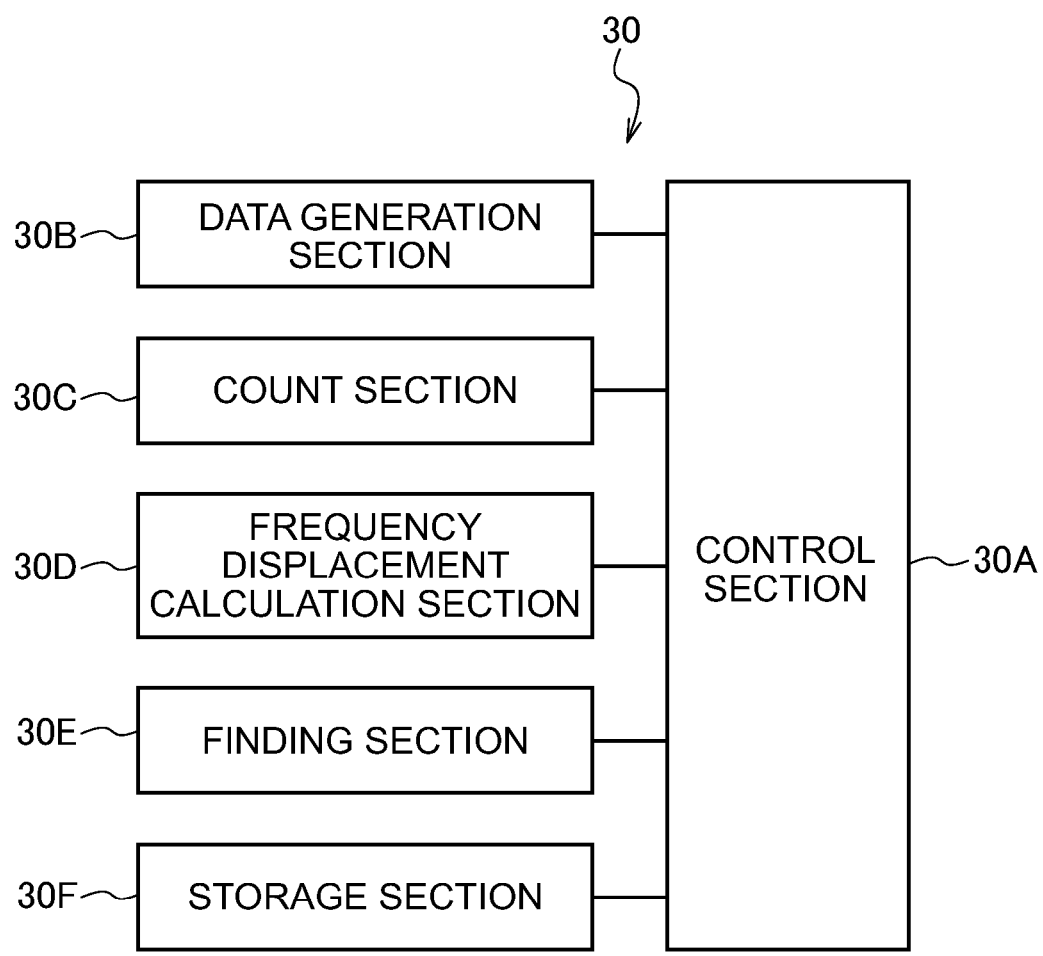
FIG. 2 is a block diagram of a modulation frequency displacement correction circuit.

As illustrated in FIG. 2, the modulation frequency displacement correction circuit 30 includes a control section 30A, a data generation section 30B, a count section 30C, a frequency displacement calculation section 30D, a finding section 30E and a storage section 30F. The data generation section 30B generates arbitrary digital modulation data of zeros and ones at a time of correction of the frequency displacement. The count section 30C counts numbers of ones or zeroes in the frequency-divided signal outputted from the programmable frequency divider 20 over a pre-specified count period. The frequency displacement calculation section 30D calculates a frequency displacement on the basis of the count value counted by the count section 30C and the frequency division ratio of the programmable frequency divider 20. The finding section 30E finds an optimum DAC adjustment value to output to the DAC 12. The storage section 30F stores the optimum DAC adjustment value found by the finding section 30E.

At a time of correction of a frequency displacement amount (for example, during LSI fabrication or the like), the modulation frequency displacement correction circuit 30 adjusts the DAC adjustment value outputted to the DAC 12 in order that the oscillation frequency of the signal outputted from the voltage-controlled oscillator 14 will be displaced about the channel frequency with high precision, with desired frequency displacements in accordance with zeros and ones of the transmission data, and stores this value.

During usual operation, the inputted transmission data is outputted to the DAC 12. When the inputted transmission data is a one, a positive DAC adjustment value is outputted to the DAC 12, and when the inputted transmission data is a zero, a negative DAC adjustment value is outputted to the DAC 12. Thus, when the input transmission data is a one, the frequency of the signal outputted from the voltage-controlled oscillator 14 is displaced to the positive side from the channel frequency by a frequency displacement corresponding to the DAC adjustment value, and when the input transmission data is a zero, the frequency of the signal outputted from the voltage-controlled oscillator 14 is displaced to the negative side from the channel frequency by the frequency displacement corresponding to the DAC adjustment value. Thus, an FSK-modulated signal with high precision is obtained.

The switch 32 switches to connect an unillustrated reference voltage power source that produces a pre-specified reference voltage with the loop filter 24 during correction of the frequency displacement, and to connect the frequency phase comparator 22 with the loop filter 24 during usual operation.

Next, processing that is executed by the modulation frequency displacement correction circuit 30 at the time of correction of the frequency displacement is described with reference to the flowchart illustrated in FIG. 3.

At the time of correction, the unillustrated reference voltage power source that produces the reference voltage is connected to the voltage-controlled oscillator 14, and the fractional-N frequency synthesizer 11 forms an open loop. Therefore, when there is no modulation, the voltage-controlled oscillator 14 oscillates at a frequency corresponding to the reference voltage. The modulation frequency displacement correction circuit 30 instructs the delta-sigma modulator 18 to fix the frequency division ratio. Hence, the programmable frequency divider 20 frequency-divides the output signal from the voltage-controlled oscillator 14 by a pre-specified frequency division ratio and outputs the result to the modulation frequency displacement correction circuit 30.

In the present embodiment, the modulation frequency displacement correction circuit 30 sets a number of bits n of the DAC adjustment value to be outputted to the DAC 12 to four bits. The most significant bit is the bit in position (n−1) and the least significant bit is the bit in position zero.

In step 100, the DAC adjustment value is initialized to zero. That is, each bit of the DAC adjustment value is initialized to zero.

In step 102, a bit number N is set to the most significant bit (in this case n−1, which is 3).

In step 104, the bit in position N of the DAC adjustment value is set to one and this is outputted to the DAC 12.

In step 106, the frequency displacement is measured. As an example, a measurement of frequency displacement when the channel frequency F0 is 2400 MHz and the frequency displacement fdev is 500 kHz is described. For simplicity of description, the frequency division ratio is taken to be 1.

In this case, the oscillation frequency of the voltage-controlled oscillator 14 when there is no modulation needs to be 2400 MHz, the oscillation frequency of the voltage-controlled oscillator 14 when the transmission data is a one needs to be 2400.5 MHz, and the oscillation frequency of the voltage-controlled oscillator 14 when the transmission data is a zero needs to be 2399.5 MHz.

Accordingly, the frequency (number of pulses) of the output signal outputted from the voltage-controlled oscillator 14 when there is no modulation, that is, when no transmission data is being outputted to the DAC 12, is counted over the pre-specified count period, for example, 1 ms. In addition, the frequency of the output signal outputted from the voltage-controlled oscillator 14 when a transmission data one is being outputted to the DAC 12, and the frequency of the output signal outputted from the voltage-controlled oscillator 14 when a transmission data zero is being outputted to the DAC 12 are counted over the pre-specified count period. Thus, if a difference between the count when there is no modulation and the count when the transmission data is a one is 500, the frequency is displaced to the positive side by 500 kHz from the channel frequency.

Figure 4:
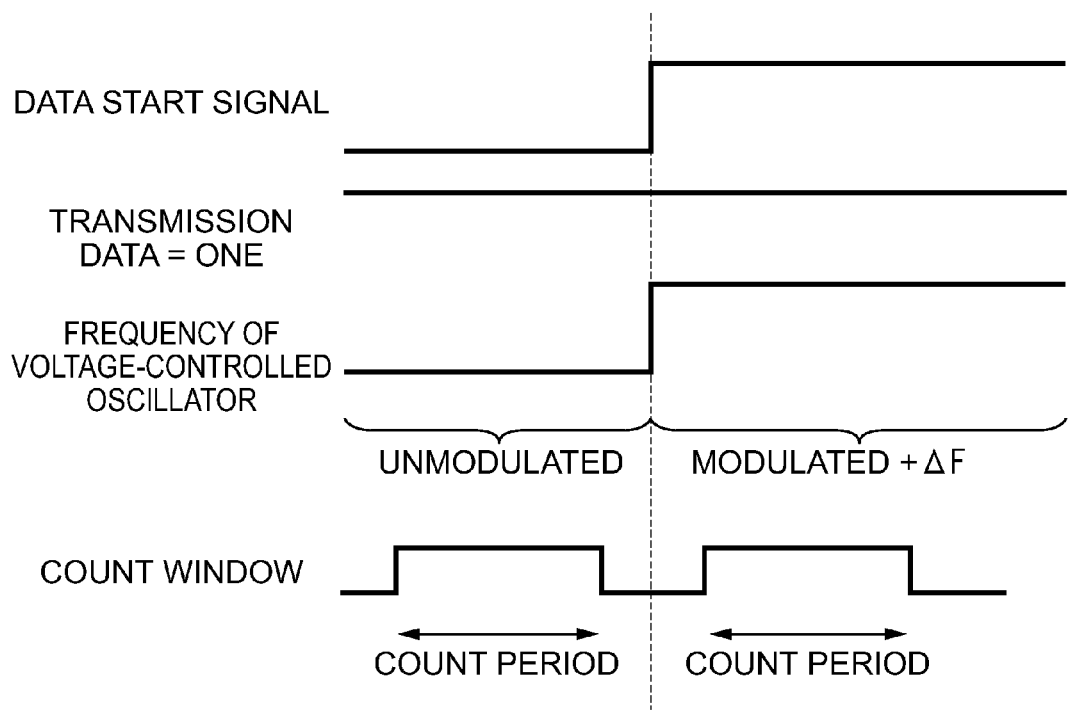
FIG. 4 is a timing chart for explaining correction of a frequency displacement.

FIG. 4 illustrates measurement of the frequency displacement+ΔF (which may take a value such as +500 kHz) when the transmission data is a one. As illustrated in FIG. 4, the frequency of the output signal outputted from the voltage-controlled oscillator 14 is initially counted over the pre-specified count period, in a state of no modulation when the transmission data one is not outputted to the DAC 12 (when a data start signal is low). Then the transmission data one is outputted to the DAC 12 (the data start signal is high), and the frequency of the output signal outputted from the voltage-controlled oscillator 14 is counted over the pre-specified count period. Hence, a count value of a difference between the two states is obtained. This count value of the difference between the two states corresponds to the frequency displacement from the channel frequency (the measured frequency displacement).

Figure 5:
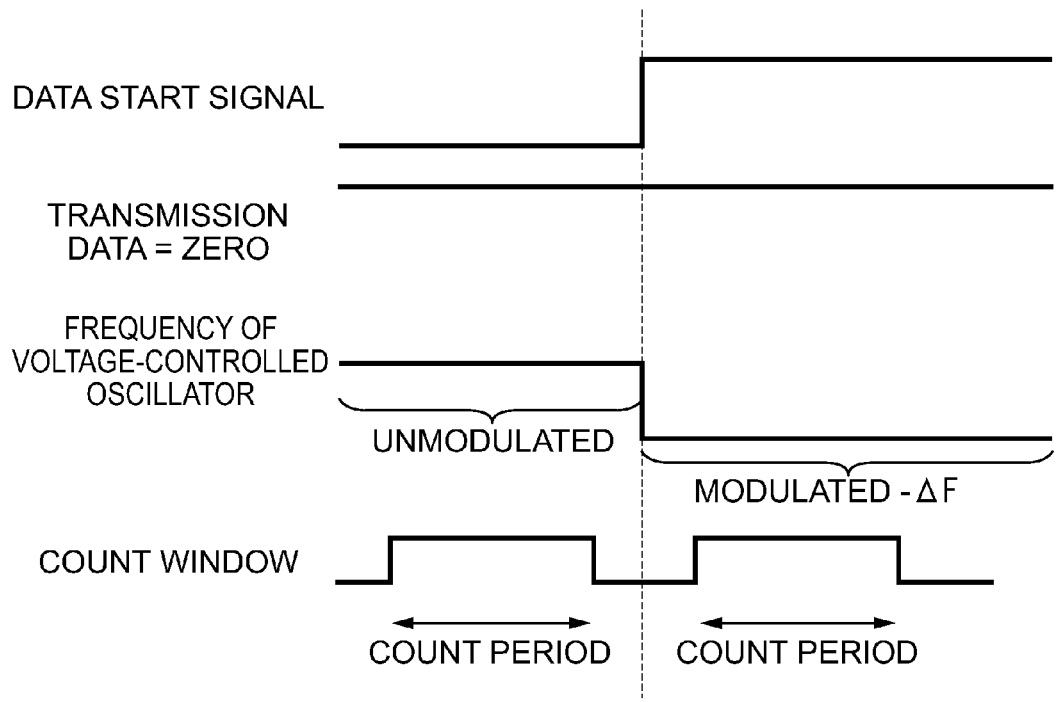
FIG. 5 is a timing chart for explaining correction of a frequency displacement.

A transmission data zero may be outputted to the DAC 12 and the frequency displacement measured. FIG. 5 illustrates measurement of a frequency displacement −ΔF (which may take a value such as −500 kHz) when the transmission data is a zero. Here too, similarly to FIG. 4, the frequency of the output signal outputted from the voltage-controlled oscillator 14 is initially counted over the pre-specified count period in the state of no modulation when the transmission data zero is not outputted to the DAC 12 (the data start signal is low). Then the transmission data zero is outputted to the DAC 12 (the data start signal is high), and the frequency of the output signal outputted from the voltage-controlled oscillator 14 is counted over the pre-specified count period. Hence, a count value of a difference between the two states is obtained. This count value of the difference between the two states corresponds to a frequency displacement from the channel frequency (a measured frequency displacement).

In step 108, it is determined whether or not the count value of the difference between the two states found in step 106 is greater than a count value (500 in this case) that corresponds to the target frequency displacement (500 kHz in this case).

If the measured frequency value is at or above the target frequency displacement, the modulation frequency displacement correction circuit 30 proceeds to step 110 and sets the bit in position N of the DAC adjustment value to zero. On the other hand, if the measured frequency value is less than the target frequency displacement, the modulation frequency displacement correction circuit 30 proceeds to step 112.

In step 112, it is determined whether or not N equals 0. If N is not 0, the modulation frequency displacement correction circuit 30 proceeds to step 114, and if N is 0, the modulation frequency displacement correction circuit 30 proceeds to step 116.

In step 114, N is updated to N−1, the modulation frequency displacement correction circuit 30 returns to step 104, and processing the same as that described above is repeated until N equals 0.

In step 116, the DAC adjustment value is stored in the storage section 30F.

Thus, in sequence from the most significant bit to the least significant bit, processing is carried out that sets each bit to one, sets the bit back to zero if the measured frequency displacement is greater than the target frequency displacement, and leaves the bit set to one if the measured frequency displacement is less than the target frequency displacement. Thus, a DAC adjustment value with which the measured frequency displacement is closest to the target frequency displacement is specified. In other words, the processing illustrated in FIG. 3 is processing that finds an optimum value of the DAC adjustment value by a binary search algorithm.

Herein, a calculation of the difference between the count value when there is no modulation and the count value during modulation when a transmission data one or a transmission data zero is outputted to the DAC 12 has been described for the measurement of frequency displacement in step 106. However, a difference between a count value during modulation when a transmission data one is outputted to the DAC and a count value during modulation when a transmission data zero is outputted to the DAC may be calculated, and it may be determined whether or not this count value corresponds to a value that is twice the target frequency displacement. In the example described above, the frequency is displaced by exactly the target frequency displacement if the count value difference is 1000.

Figure 6:
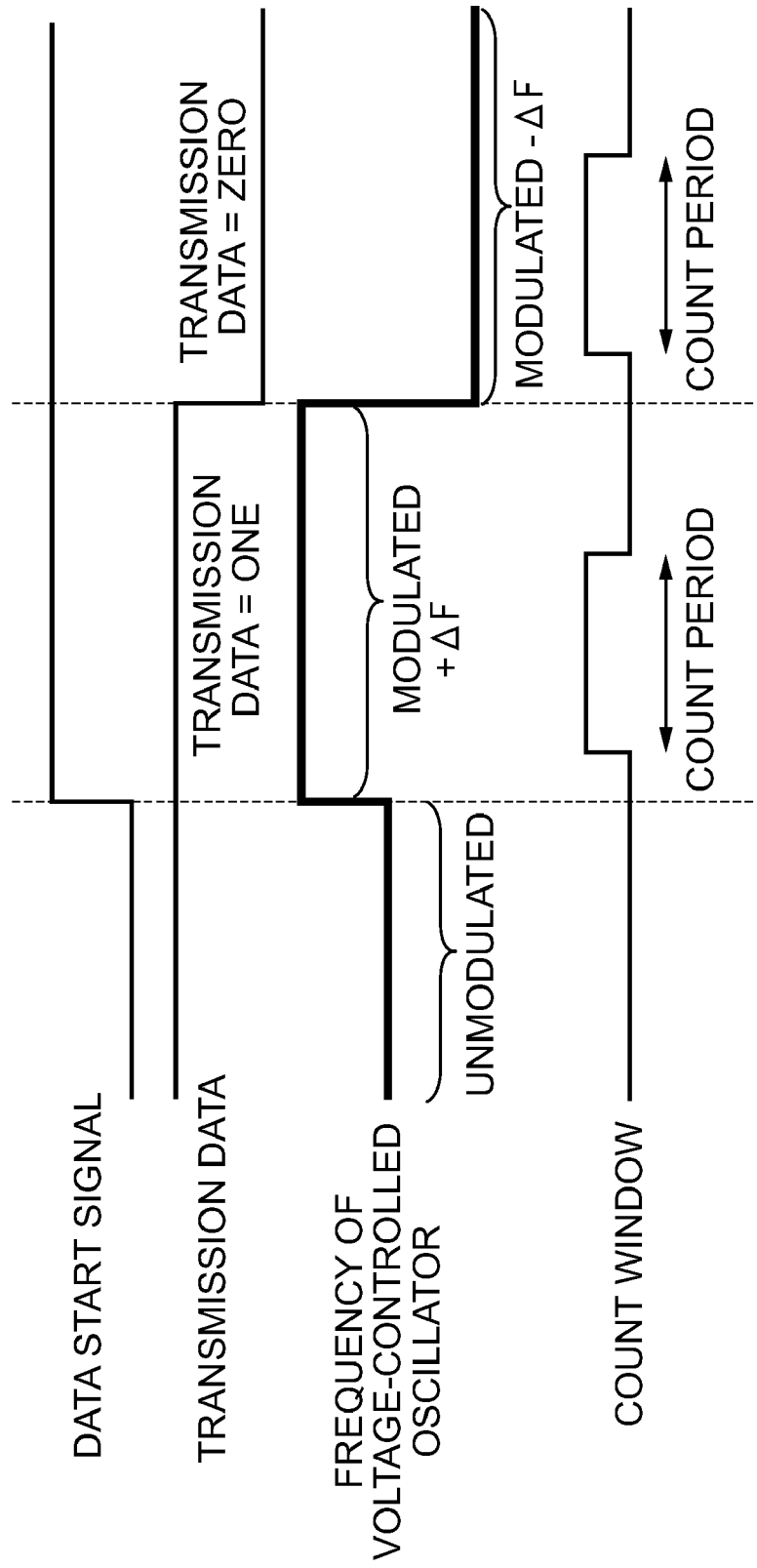
FIG. 6 is a timing chart for explaining correction of a frequency displacement.

FIG. 6 illustrates a calculation of the difference between the count value during modulation when a transmission data one is outputted to the DAC 12 and the count value during modulation when a transmission data zero is outputted to the DAC 12, and measurement of the frequency displacement+/− ΔF (which may take values such as +/−500 kHz). Here, first the transmission data one is outputted to the DAC 12 and the frequency of the output signal outputted from the voltage-controlled oscillator 14 is counted over the pre-specified count period. Then the transmission data zero is outputted to the DAC 12 and the frequency of the output signal outputted from the voltage-controlled oscillator 14 is counted over the pre-specified count period. Hence, the count value of the difference between the two states is obtained. A value that is half of this count value of the difference between the two states corresponds to the frequency displacement from the channel frequency.

Thus, in comparison with calculating the difference between the count value when there is no modulation and the count value during modulation when a transmission data one or a transmission data zero is outputted to the DAC 12, twice the difference is obtained with the same count period. Therefore, the DAC adjustment value may be found with twice the precision. Conversely, the DAC adjustment value may be found with the same precision with the count period being halved.

In general, when the count period is lengthened and the count value increases, the frequency displacement may be corrected with better precision but the correction takes a longer time. Accordingly, the processing described above may be carried out with a frequency displacement that is N times the actual target frequency displacement serving as the target frequency displacement, and 1/N times the DAC adjustment value that is obtained as a result being specified as the DAC adjustment value to be outputted to the DAC 12. Thus, the DAC adjustment value may be found with higher precision without the count period being lengthened.

Figure 7:
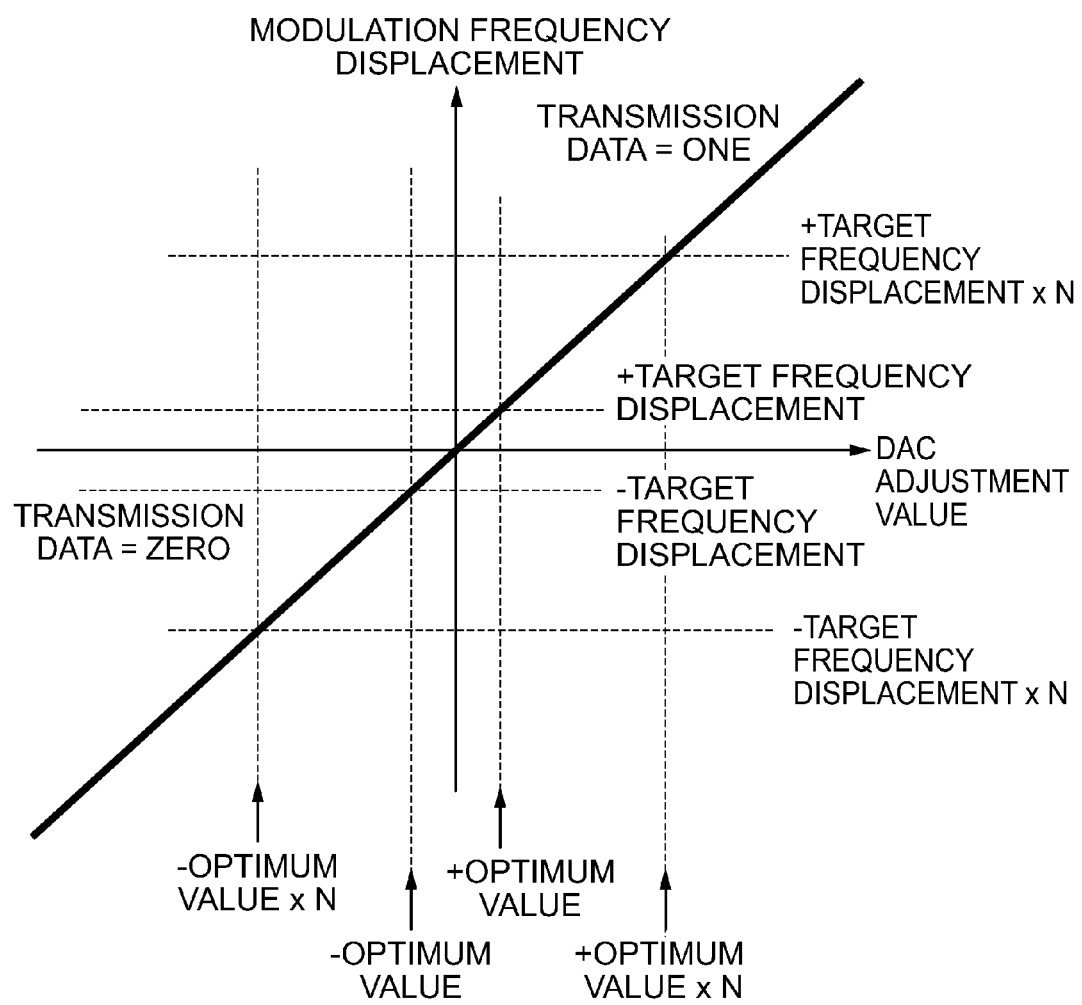
FIG. 7 is a diagram illustrating a relationship between DAC adjustment value and modulation frequency displacement.

FIG. 7 illustrates the relationship between DAC adjustment value and frequency displacement. As illustrated in FIG. 7, to obtain a frequency displacement that is N times the target frequency displacement, it is sufficient to output a DAC adjustment value of N times the optimum DAC adjustment value for obtaining the target adjustment value to the DAC 12. Therefore, if an optimum DAC adjustment value for obtaining a frequency displacement of N times the target frequency displacement is divided by N, the optimum DAC adjustment value for obtaining the target adjustment value is found.

Figure 8:
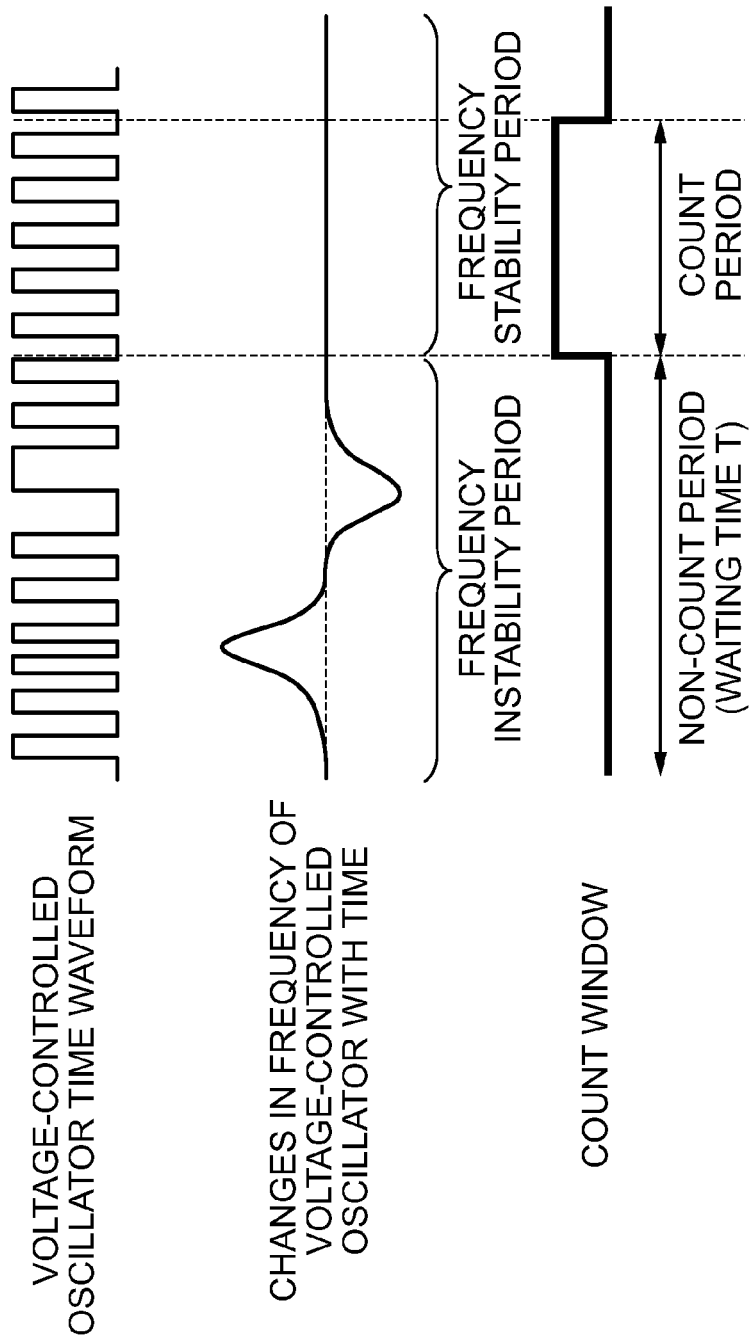
FIG. 8 is a timing chart for describing a case in which a frequency is not counted in a frequency instability period.

Incidentally, at the time of correction, if the processing described above is carried out immediately after the fractional-N frequency synthesizer 11 is made open-loop, the frequency of the output signal of the voltage-controlled oscillator 14 may not be accurately counted, due to a frequency drift just after the voltage-controlled oscillator 14 goes open-loop. Accordingly, as illustrated in FIG. 8, it is preferable to execute the processing described above in a stable frequency period after a pre-specified waiting time T for the oscillation frequency of the voltage-controlled oscillator 14 to stabilize (a frequency instability period) has passed. Hence, the DAC adjustment value may be found with high precision.

Furthermore, when the frequency of the voltage-controlled oscillator 14 is being counted while open-loop, the count value may go beyond a tolerance range of the oscillation frequency of the voltage-controlled oscillator 14 due to environmental changes such as external noise and the like. Accordingly, if the count value goes outside a pre-specified tolerance range about the channel frequency, that count value may be ignored and the counting repeated. For example, if the channel frequency is 2.4 GHz and the count period is 1 μs, then ideally the count value when there is no modulation should be 2400. Thus, if it may be determined that the frequency is abnormal and there is an effect from noise or the like beyond a range of, for example, ±100 MHz about 2.4 GHz, a threshold is set to 100 (corresponding to 100 MHz). Hence, even if a count value is abnormal due to the effects of noise or the like, the DAC adjustment value may be found with high precision by re-counting the count value.

-Second Embodiment-

Next, a second embodiment of the present invention is described. Herein, portions that are the same as in the first embodiment are assigned the same reference numerals, and detailed descriptions thereof are not given.

Figure 9:
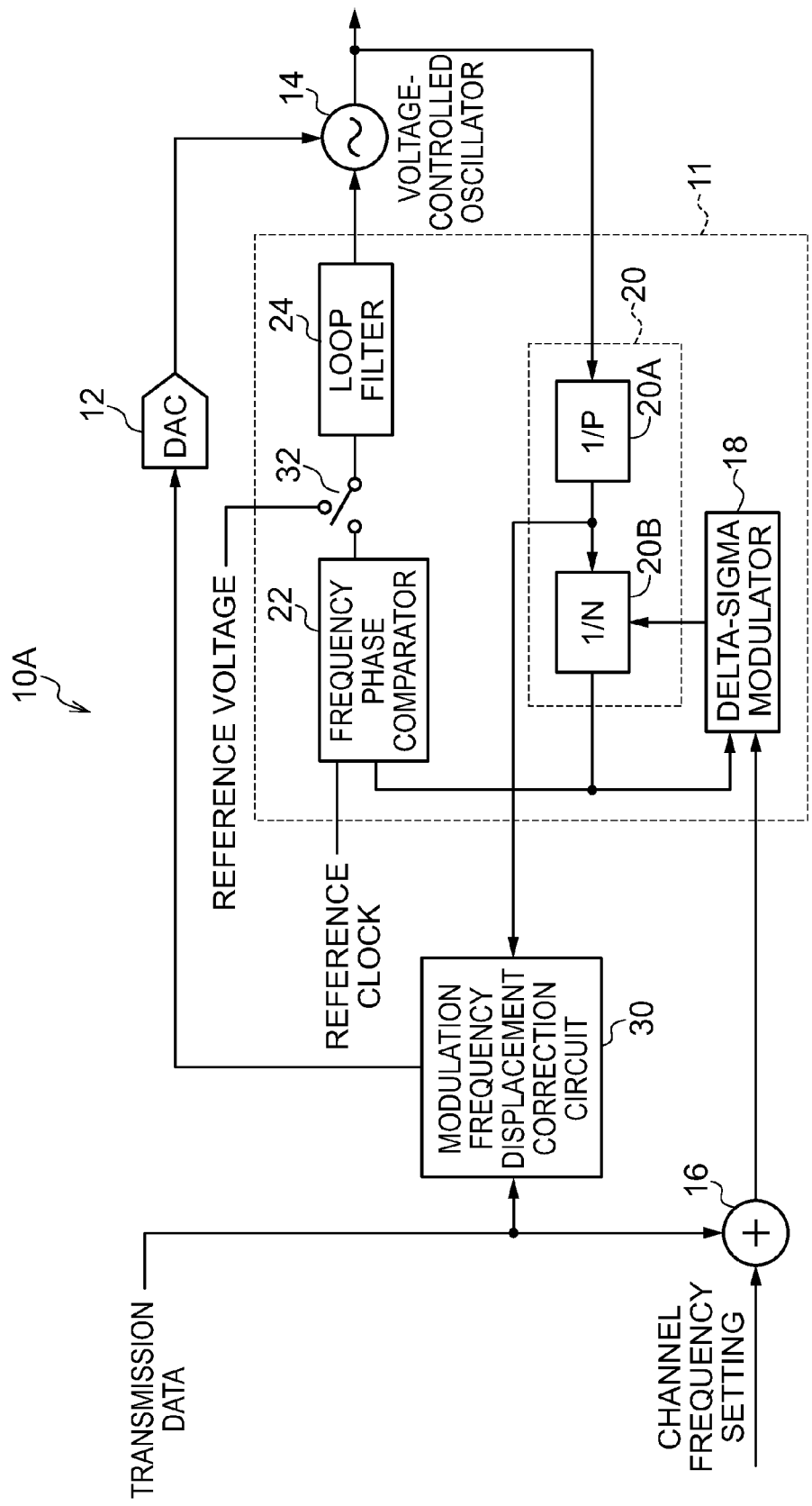
FIG. 9 is a structural diagram of a frequency synthesizer device relating to a second embodiment.

FIG. 9 illustrates a frequency synthesizer device 10A relating to the present embodiment. In the present embodiment, the programmable frequency divider 20 is -constituted with a frequency pre-divider 20A and a frequency divider 20B. The present embodiment differs from the frequency synthesizer device 10 described in the first embodiment in that an output signal from the frequency pre-divider 20A is outputted to the modulation frequency displacement correction circuit 30.

In the frequency pre-divider (pre-scaler) 20A, the output signal from the voltage-controlled oscillator 14 is frequency-divided by a pre-specified frequency division ratio 1/P, and the result is outputted to the frequency divider 20B and the modulation frequency displacement correction circuit 30.

The frequency divider 20B frequency-divides the signal outputted from the frequency pre-divider 20A by a pre-specified frequency division ratio 1/N, and outputs the result to the frequency phase comparator 22 and the delta-sigma modulator 18.

In this constitution, the frequency division ratio of the frequency pre-divider 20A is fixed for both times of usual operation and times of correction. Therefore, there is no need for the modulation frequency displacement correction circuit 30 to output a control signal for fixing the frequency division ratio to the delta-sigma modulator 18 at a time of correction, and control of the modulation frequency displacement correction circuit 30 may be simplified.

-Third Embodiment-

Next, a third embodiment of the present invention is described. Herein, portions that are the same as in the above embodiments are assigned the same reference numerals and detailed descriptions thereof are not given.

Figure 10:
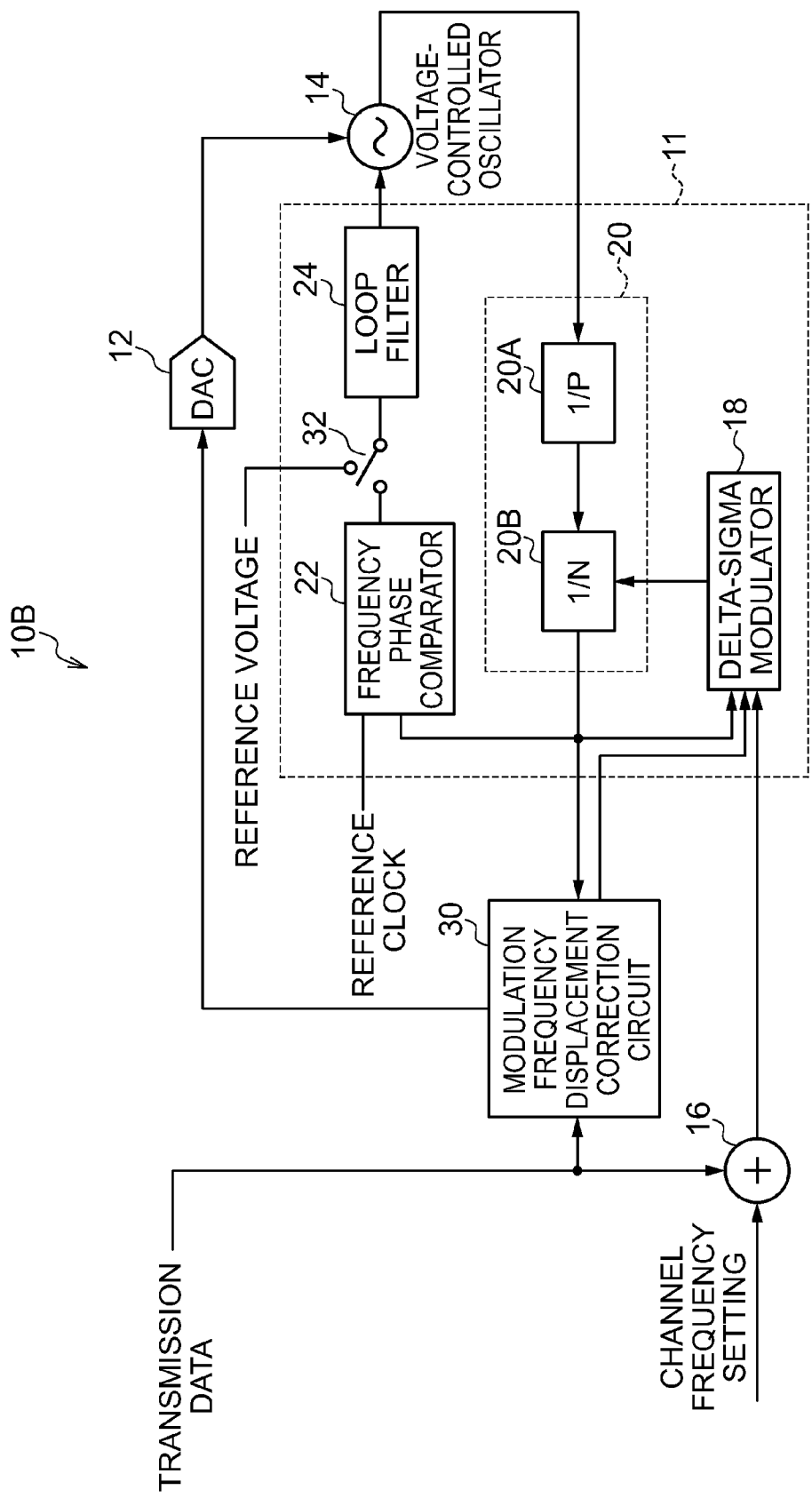
FIG. 10 is a structural diagram of a frequency synthesizer device relating to a third embodiment.

FIG. 10 illustrates a frequency synthesizer device 10B relating to the present embodiment. In the present embodiment, the programmable frequency divider 20 is constituted with the frequency pre-divider 20A and the frequency divider 20B. The present embodiment differs from the frequency synthesizer device 10B described in the second embodiment in that the output signal from the frequency divider 20B is outputted to the modulation frequency displacement correction circuit 30.

In the frequency synthesizer device 10B relating to the present embodiment, the delta-sigma modulator 18 does not instruct the programmable frequency divider 20 to fix the frequency division ratio at a time of correction, and the delta-sigma modulator 18 outputs a delta-sigma modulated signal to the frequency divider 20B the same as during usual operation.

With this constitution, the output signal from the voltage-controlled oscillator 14 may be frequency-divided by fractions, and the oscillation frequency may be corrected by shifting in finer steps.

-Fourth Embodiment-

Next, a fourth embodiment of the present invention is described. In the present embodiment, a case is described in which the count period in the processing of step 106 of FIG. 3 is set for each bit of the DAC adjustment value on the basis of a weighting of the modulation frequency displacement for each bit.

For example, if the DAC adjustment value has four bits, the output voltage per least significant bit is 100 mV, the modulation sensitivity Kvo of the voltage-controlled oscillator 14 is 0.5 MHz/V, and the bits of the DAC adjustment value are represented by DAC<3> to DAC<0>, a relationship between the output voltage from the DAC 12 (mV) and the modulation frequency displacement (kHz) is as illustrated in Table 1.

TABLE 1

|  | DAC<3> | DAC<2> | DAC<1> | DAC<0> |
|---|---|---|---|---|
| DAC output voltage (mV) | 800 | 400 | 200 | 100 |
| Modulation frequency displacement (kHz) | 400 | 200 | 100 | 50 |

Now it is assumed that the channel frequency is 2400 MHz, the frequency displacement is 500 kHz, the modulation frequency with transmission data one is 2400.5 MHz, the modulation frequency with transmission data zero is 2399.5 MHz and the oscillation frequency of the voltage-controlled oscillator 14 when there is no modulation is an FSK-modulated wave at 2400 MHz, and the count period is set to 1 ms. In this case, because the frequency displacement is 500 kHz, if the measured frequency displacements are obtained in step 106 of FIG. 3 on the basis of the count value when the transmission data is one and the count value when the transmission date is zero as illustrated in FIG. 6, the target frequency displacement used in the determination of step 108 is 1000 kHz.

According to Table 1, the weighting of the frequency displacement is, for example, 400 kHz for the bit in position 3 of the DAC adjustment value, that is, DAC<3>. Therefore, if the DAC adjustment value is DAC(3:0)=1000, because the count period is 1 ms, in ideal conditions the count value when the transmission data is one is 2,400,400 and the count value when the transmission data is zero is 2,399,600.

In this case, the difference between the count values when the transmission data is one and when the transmission date is zero is 800, which is offset by 200 from the target value. Because the bit resolution of DAC<3> is 400 kHz according to Table 1, it may be determined whether or not to set the bit at DAC<3> even if the count period in step 106 of FIG. 3 is shorter than 1 ms. For example, in the case of DAC<3>, even if the count period is 10 μs, which is ¹⁄₁₀₀ of 1 ms, the processing of FIG. 3 may determine whether or not to set the bit at DAC<3>.

Figure 3:
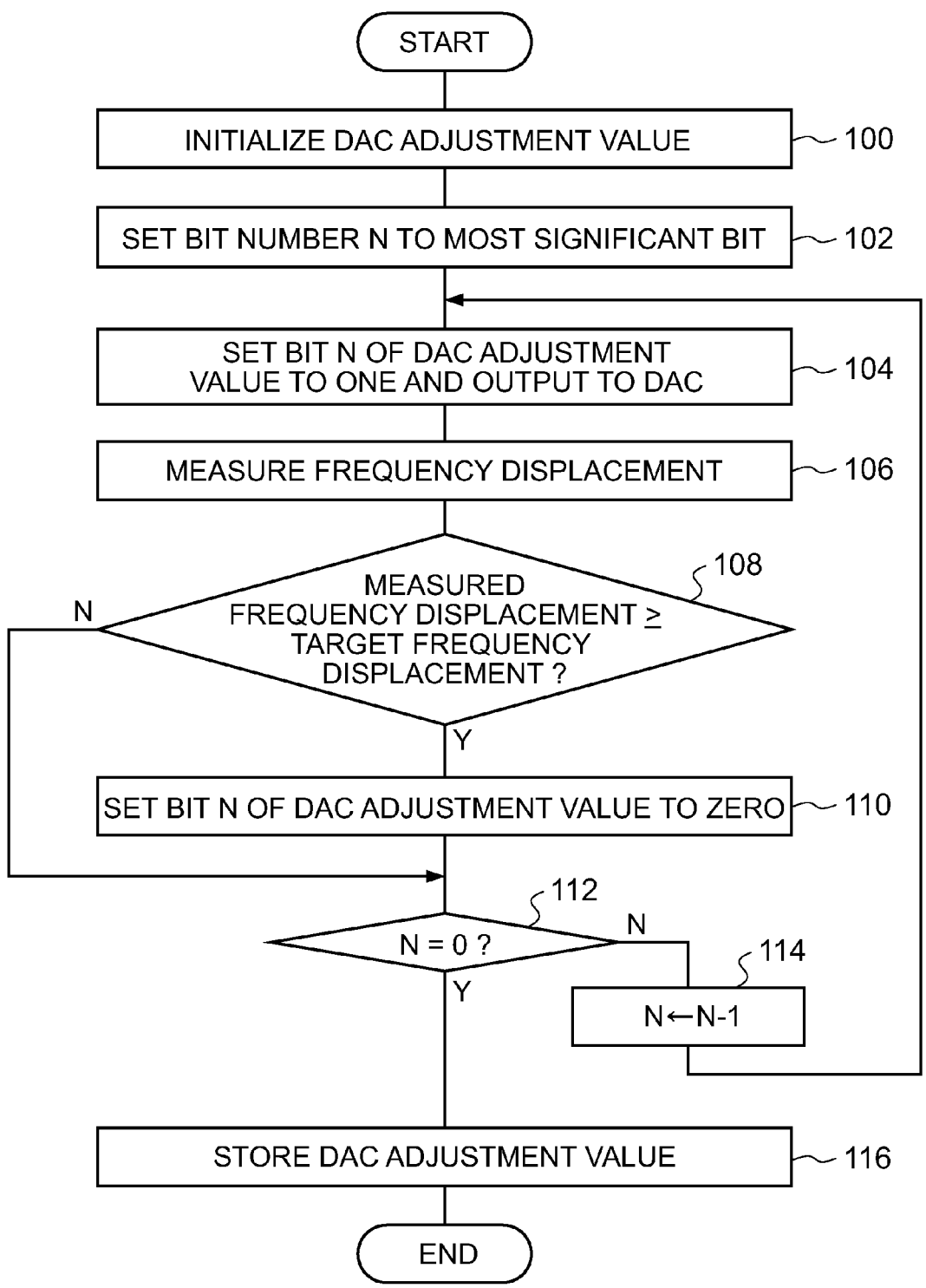
FIG. 3 is a flowchart of processing that is executed by the modulation frequency displacement correction circuit.

Therefore, in the processing of FIG. 3, the count period may be specified for each bit such that the count period gets longer from the most significant bit to the least significant bit of the DAC adjustment value, that is, as the weighting of the frequency displacement decreases. Therefore, in comparison with a case in which the count period is fixed for every bit, a duration to find the optimum DAC adjustment value may be shortened.

-Fifth Embodiment-

Next, a fifth embodiment of the present invention is described. In the present embodiment, a case is described in which the processing of step 106 of FIG. 3 is carried out only for pre-specified bits of the DAC adjustment value, on the basis of a weighting of the modulation frequency displacement for each bit, and the other bits are set on the basis of the results of the processing of step 106 for the pre-specified bits.

Now a case is described in which the assumed FSK-modulated waves are the same as in the fourth embodiment, and the output voltage per least significant bit, the modulation sensitivity Kvo of the voltage-controlled oscillator 14, the bits DAC<3> to DAC<0> of the DAC adjustment value, and the relationship between the output voltage from the DAC 12 (mV) and the modulation frequency displacement (kHz) are the same as in the fourth embodiment.

For example, if the DAC adjustment value is DAC(3:0) =1000, because the count period is 1 ms, in ideal conditions the count value when the transmission data is one is 2,400,400 and the count value when the transmission data is zero is 2,399,600, and the difference is 800. Thus, when the measured frequency displacement is obtained on the basis of the count value when the transmission data is one and the count value when the transmission data is zero, it is determined that the frequency displacement is offset by 200 from the target value of 1000, and that the frequency displacement is small by 100 kHz.

Accordingly, by setting the bit at DAC<1>, for which the weighting of the frequency displacement according to the above Table 1 is 100 kHz, the frequency displacement may be made up by an amount corresponding to the 100 kHz deficiency. Therefore, the DAC adjustment amount may be set to DAC(3:0)=1010.

Thus, the processing of step 106 of FIG. 3 may be applied only to a particular bit and, by specifying the other bits on the basis of the results of this processing, the processing of step 106 of FIG. 3 may be carried out just one time, and processing that sets bits with weightings corresponding to frequency displacements as described above may be executed instead of the processing of step 108 to step 114. Thus, a duration for specifying the DAC adjustment value may be shortened.

-Sixth Embodiment-

Next, a sixth embodiment of the present invention is described. In the present embodiment, a case is described in which a voltage-controlled oscillator at which a sensitivity factor of the voltage-controlled oscillator may be selected is used. Herein, portions other than the voltage-controlled oscillator that are the same as in the frequency synthesizer device 10 described in the first embodiment are not described in detail.

Figure 11:
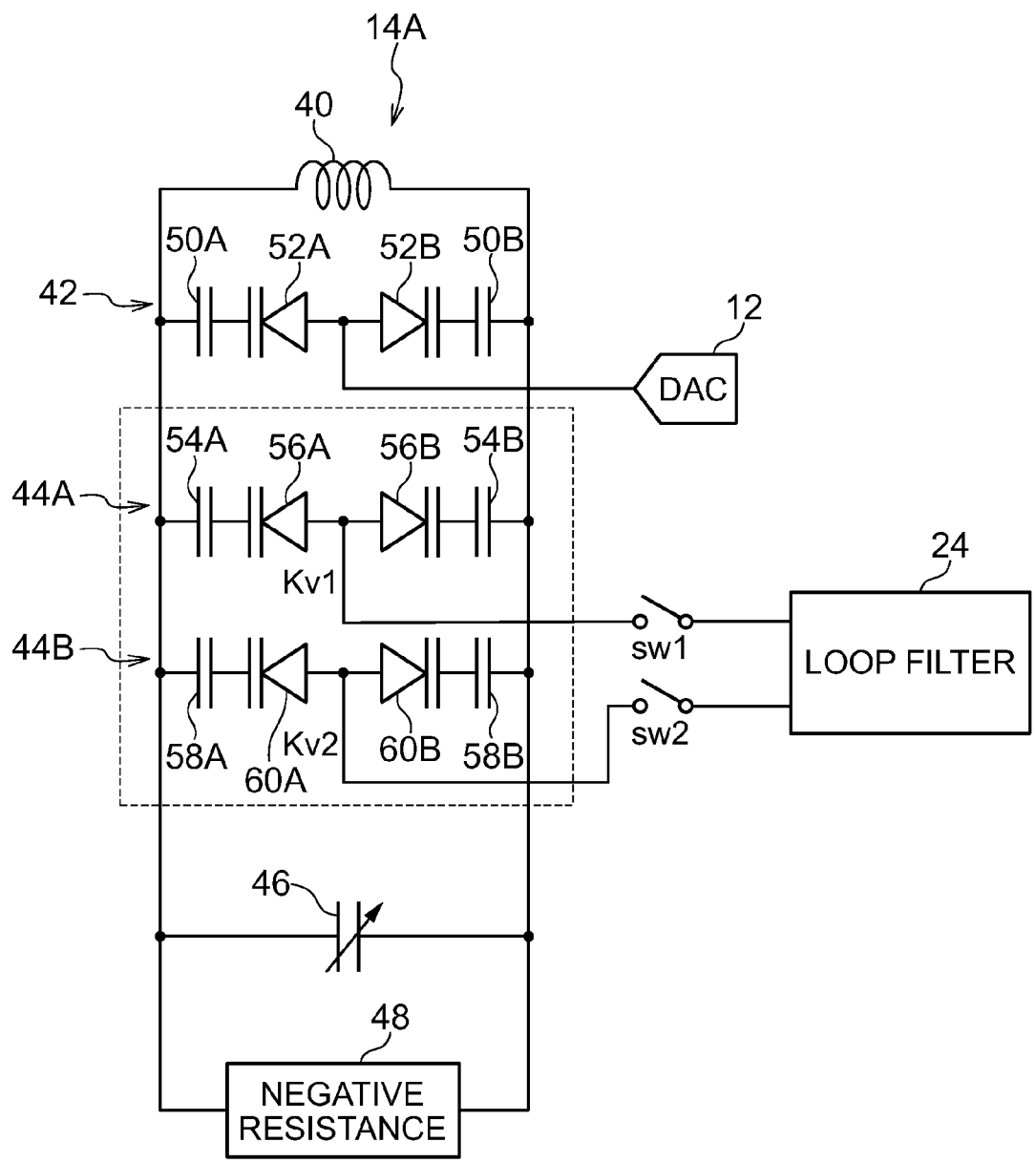
FIG. 11 is a structural diagram of a voltage-controlled oscillator relating to a sixth embodiment.

FIG. 11 illustrates a voltage-controlled oscillator 14A relating to the present embodiment. As illustrated in FIG. 11, the voltage-controlled oscillator 14A is constituted with a coil 40, variable capacitance circuits 42, 44A and 44B, a variable capacitance device 46, and a negative resistance 48 being connected in parallel.

The variable capacitance circuit 42 is constituted with a capacitor 50A, variable capacitance diodes (varicaps) 52A and 52B, and a capacitor 50B being connected in series. The output terminal of the DAC 12 is connected to between the variable capacitance diodes 52A and 52B.

The variable capacitance circuit 44A is constituted with a capacitor 54A, variable capacitance diodes 56A and 56B, and a capacitor 54B being connected in series. The loop filter 24 is connected to between the anodes of the variable capacitance diodes 56A and 56B, via a switch SW1.

The variable capacitance circuit 44B is constituted with a capacitor 58A, variable capacitance diodes 60A and 60B, and a capacitor 58B being connected in series. The loop filter 24 is connected to between the anodes of the variable capacitance diodes 60A and 60B, via a switch SW2.

A voltage sensitivity (which corresponds to capacitance) Kv1 of the variable capacitance diodes 56A and 56B and a voltage sensitivity (corresponding to capacitance) Kv2 of the variable capacitance diodes 60A and 60B have different values. For example, Kv1>Kv2.

During usual operation the switch SW1 is turned on and the switch SW2 is turned off, and the variable capacitance circuit 44A is selected. On the other hand, during a correction operation the switch SW2 is turned on and the switch SW1 is turned off, and the variable capacitance circuit 44B is selected. Thus, the voltage sensitivity of the voltage-controlled oscillator 14A during a correction operation is lower than during usual operation, and a deterioration in the precision of correction due to phase noise that occurs when the fractional-N frequency synthesizer 11 goes open-loop may be suppressed.

-Seventh Embodiment-

Next, a seventh embodiment of the present invention is described. In the present embodiment, a case is described of using a voltage-controlled oscillator equipped with a plural number of variable capacitance circuits connected to the DAC 12. Herein, portions other than the voltage-controlled oscillator that are the same as in the frequency synthesizer device 10 described in the first embodiment are not described in detail, and portions that are the same as in the voltage-controlled oscillator 14A described in the sixth embodiment are assigned the same reference numerals and are not described in detail.

Figure 12:
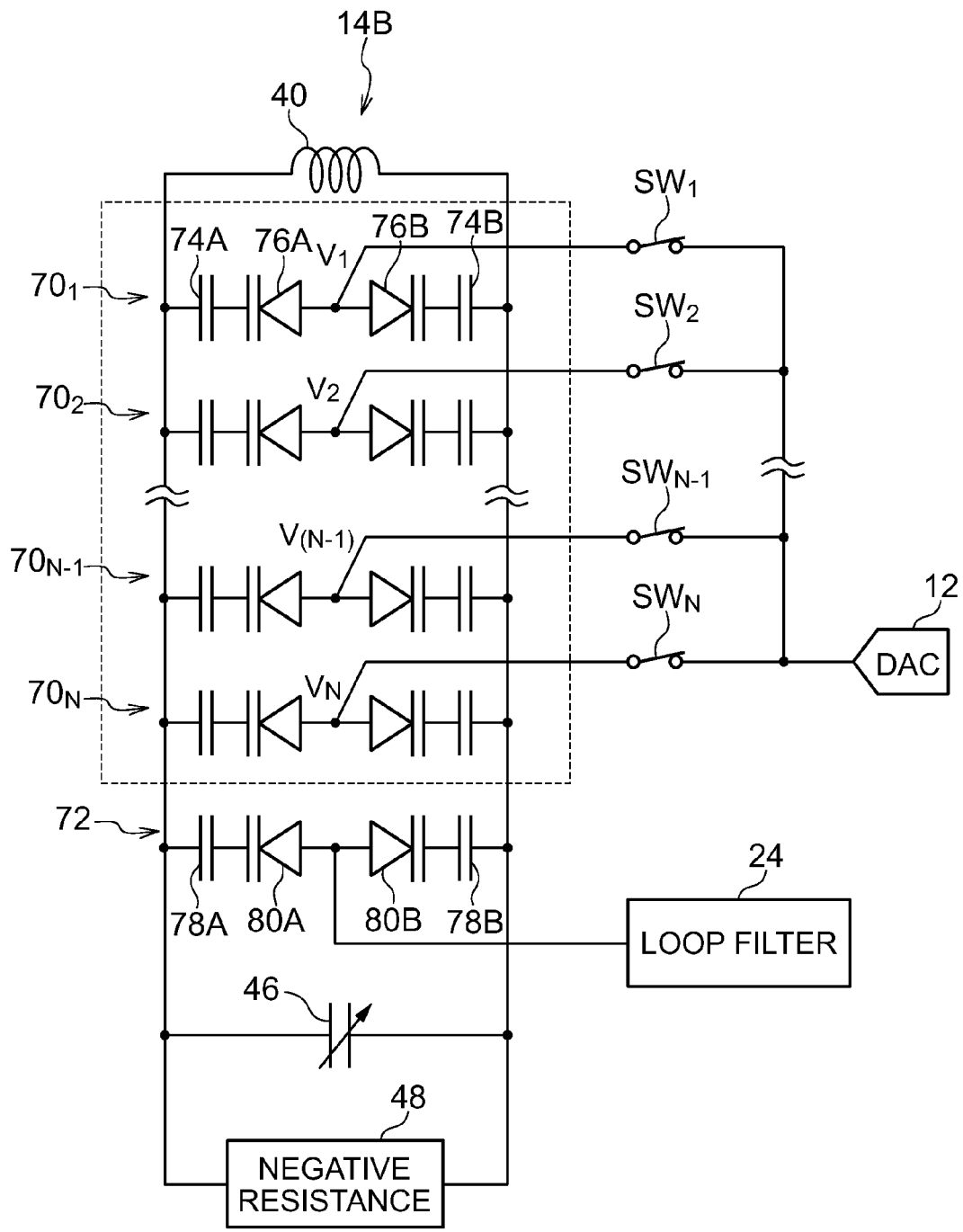
FIG. 12 is a structural diagram of a voltage-controlled oscillator relating to a seventh embodiment.

FIG. 12 illustrates a voltage-controlled oscillator 14B relating to the present embodiment. As illustrated in FIG. 12, the voltage-controlled oscillator 14B is constituted with the coil 40, N variable capacitance circuits $70_1$ to $70_N$, a variable capacitance circuit 72, the variable capacitance circuit 46 and the negative resistance 48 being connected in parallel.

The variable capacitance circuits $70_1$ to $70_N$ are connected to the DAC 12 via switches $SW_1$ to $SW_N$.

Structures of the variable capacitance circuits $70_1$ to $70_N$ are the same, being each constituted with a capacitor 74A, variable capacitance diodes 76A and 76B, and a capacitor 74B connected in series. Thus, capacitance values of the variable capacitance circuits $70_1$ to $70_N$ are the same.

The variable capacitance circuit 72 is constituted with a capacitor 78A, variable capacitance diodes 80A and 80B, and a capacitor 78B being connected in series. Thus, the capacitance value is the same as the capacitance values of the variable capacitance circuits $70_1$ to $70_N$.

In the voltage-controlled oscillator 14B with this structure, pre-specified switches among the N switches are turned on during usual operation, and the other switches are turned off. During correction, all of the N switches are turned on and an optimum DAC adjustment value is found with a target frequency displacement of N times the actual target frequency displacement serving as a target frequency displacement.

Figure 13:
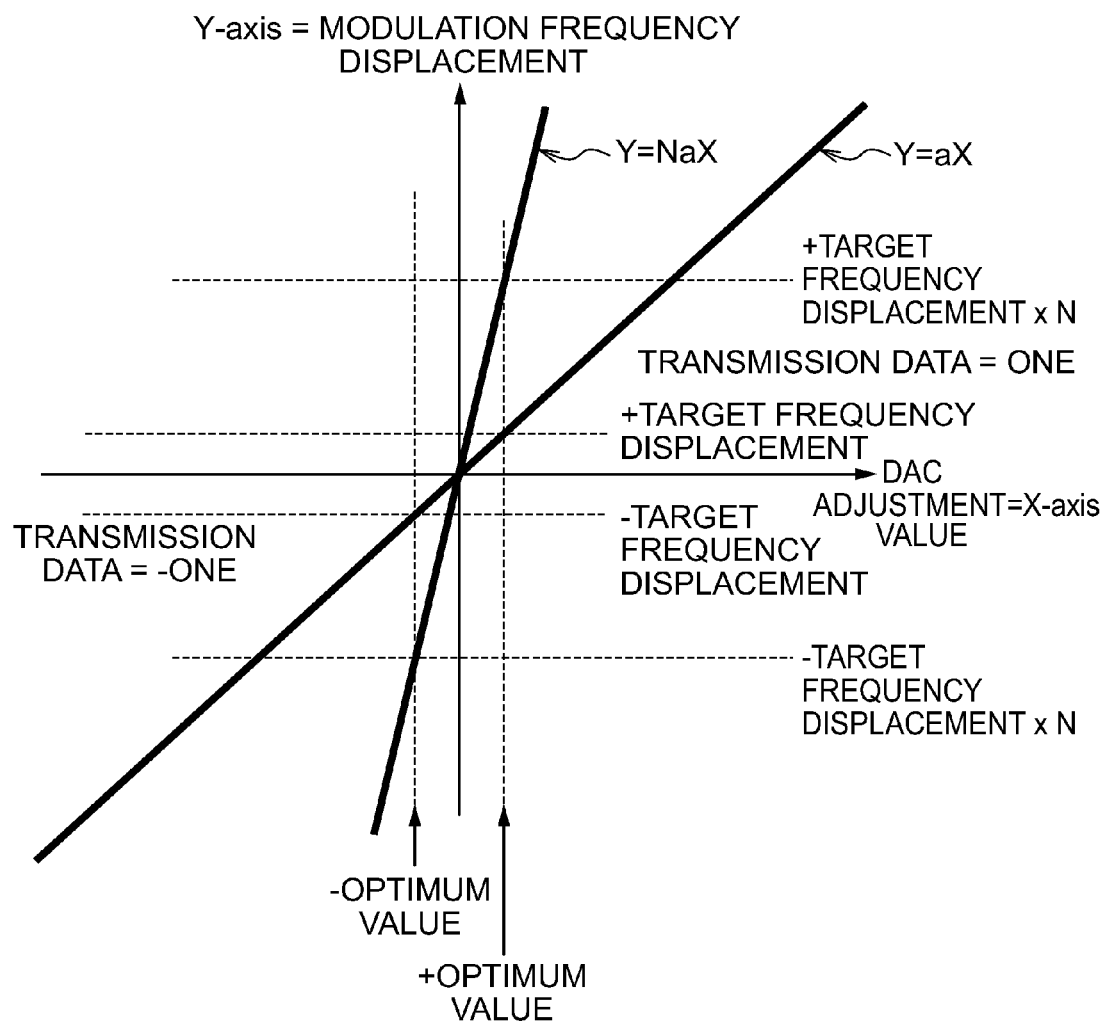
FIG. 13 is a diagram illustrating a relationship between DAC adjustment value and modulation frequency displacement.

FIG. 13 illustrates a relationship between the DAC adjustment value shown as an x-axis and frequency displacement shown as a y-axis when the voltage-controlled oscillator 14B relating to the present embodiment is used. As illustrated in FIG. 13, a gradient Na of the frequency displacement with respect to the DAC adjustment value when all N switches are turned on is N times a gradient a of the modulation frequency displacement with respect to the DAC adjustment value when one switch is turned on. Therefore, the DAC adjustment value corresponding to the actual target frequency displacement may be found by turning on all N switches and finding a DAC adjustment value with a target frequency displacement of N times the actual target frequency displacement serving as a target frequency displacement. Furthermore, because the plural variable capacitance circuits $70_1$ to $70_N$ are provided, it is possible to handle correction of a variety of frequency displacements.

-Eighth Embodiment-

Next, an eighth embodiment of the present invention is described. In the present embodiment, a variant when a voltage-controlled oscillator equipped with a plural number of variable capacitance circuits connected to the DAC 12 is used is described. Herein, portions other than the voltage-controlled oscillator that are the same as in the frequency synthesizer device 10 described in the first embodiment are not described in detail, and portions that are the same as in the voltage-controlled oscillator 14B described in the seventh embodiment are assigned the same reference numerals and are not described in detail.

Figure 14:
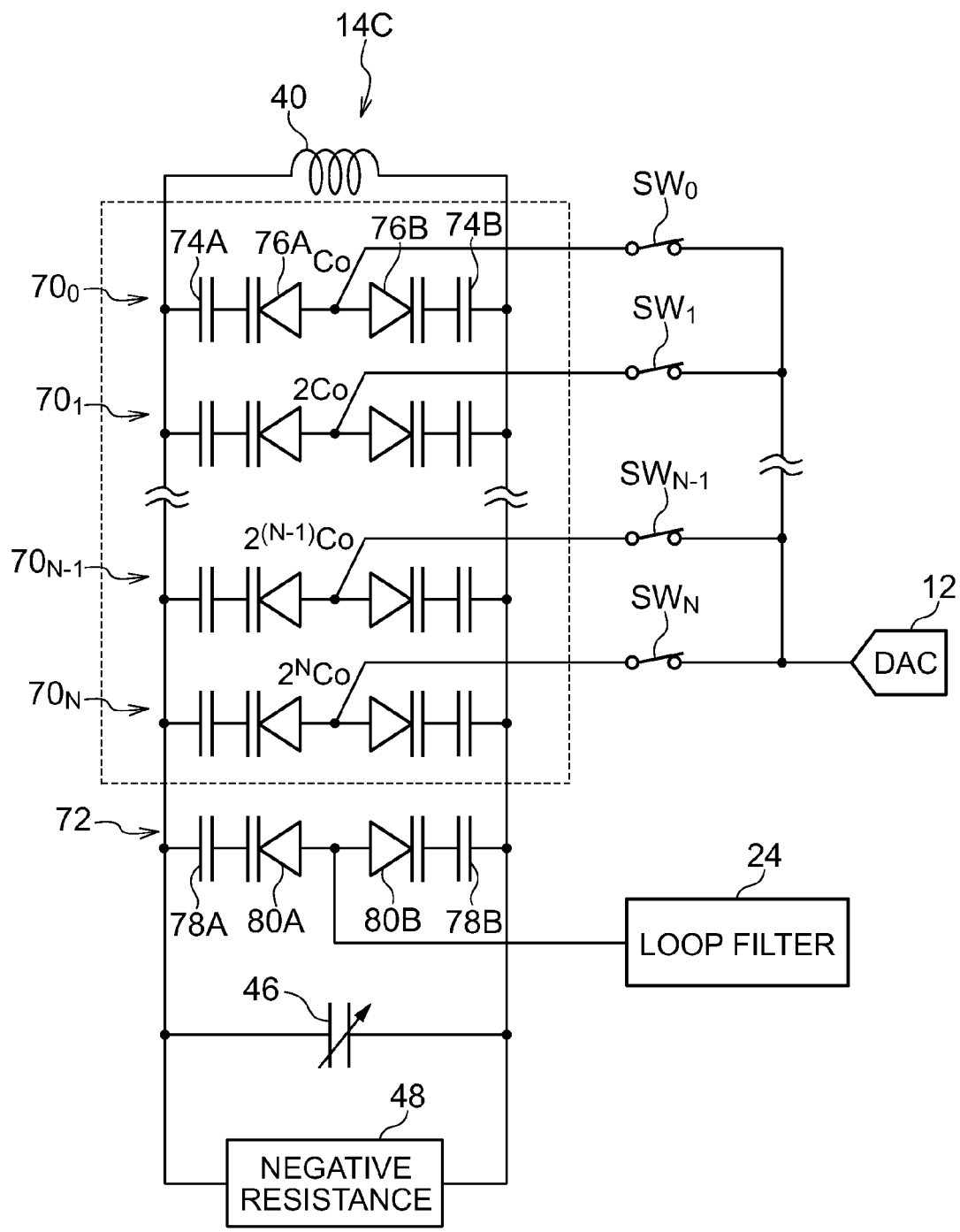
FIG. 14 is a structural diagram of a voltage-controlled oscillator relating to an eighth embodiment.

FIG. 14 illustrates a voltage-controlled oscillator 14C relating to the present embodiment. As illustrated in FIG. 14, the voltage-controlled oscillator 14C is constituted with the coil 40, N+1 variable capacitance circuits $70_0$ to $70_N$, the variable capacitance circuit 72, the variable capacitance circuit 46 and the negative resistance 48 being connected in parallel.

The variable capacitance circuits $70_0$ to $70_N$ are connected to the DAC 12 via switches $SW_0$ to $SW_N$.

Structures of the variable capacitance circuits $70_0$ to $70_N$ are the same as in the voltage-controlled oscillator 14B of FIG. 12, but differ from the voltage-controlled oscillator 14B in being constituted such that the capacitance values have ratios that are powers of 2. That is, if the capacitance value of the variable capacitance circuit $70_0$ is C0 $(=2^0 \times C0)$, the capacitance value of the variable capacitance circuit $70_1$ is $2^1 \times C0$, the capacitance value of the variable capacitance circuit $70_2$ is $2^2 \times C0$, . . . , and the capacitance value of the variable capacitance circuit $70_N$ is $2^N \times C0$.

With this constitution such that the capacitance values of the variable capacitance circuits $70_0$ to $70_N$ are in ratios that are powers of 2, compared with the voltage-controlled oscillator 14B described in the seventh embodiment, the number of variable capacitance circuits connected to the DAC 12 may be decreased, and the size of the circuit may be reduced.

-Ninth Embodiment-

Next, a ninth embodiment of the present invention is described. In the present embodiment, a case is described in which correction of the frequency displacement is carried out and an optimum DAC adjustment value is found for a single channel frequency and, on the basis of that result, DAC adjustment values of frequency displacements are found for other channel frequencies. Herein, the device constitution is the same as in the frequency synthesizer device 10 described in the first embodiment, so is not described in detail. Portions that are the same as in the voltage-controlled oscillator 14A of FIG. 11 are assigned the same reference numerals and are not described in detail.

Figure 15:
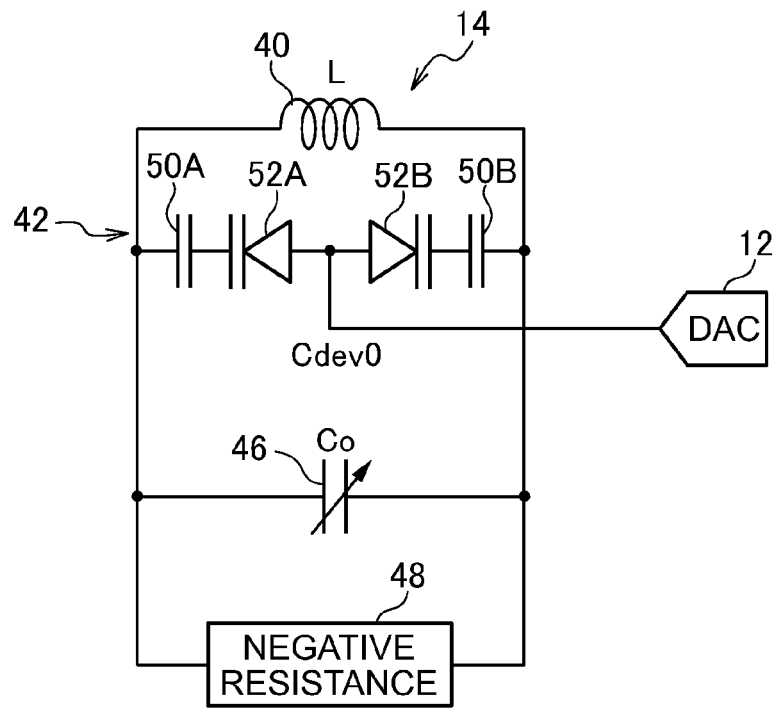
FIG. 15 is a structural diagram of a voltage-controlled oscillator relating to a ninth embodiment.

FIG. 15 illustrates structure of the voltage-controlled oscillator 14. A variable capacitance circuit to which the loop filter 24 is connected is not illustrated in FIG. 15. The voltage-controlled oscillator 14 is constituted with the coil 40, the variable capacitance circuit 42, the variable capacitance circuit 46 and the negative resistance 48 being connected in parallel. The variable capacitance circuit 42 is constituted with the capacitor 50A, the variable capacitance diodes 52A and 52B, and the capacitor 50B being connected in series. The output terminal of the DAC 12 is connected to between the anodes of the variable capacitance diodes 52A and 52B.

If, for example, the inductance of the coil 40 is represented by L, the capacitance of the variable capacitance circuit 42 is represented by Cdev0, the capacitance of the variable capacitance circuit 46 is represented by C0, and the channel frequency (modulation frequency) is represented by F0, the following expression applies.

$$F0 = 1/(2\pi \cdot sqrt(L(C0 + Cdev0))) \quad (1)$$

Figure 16:
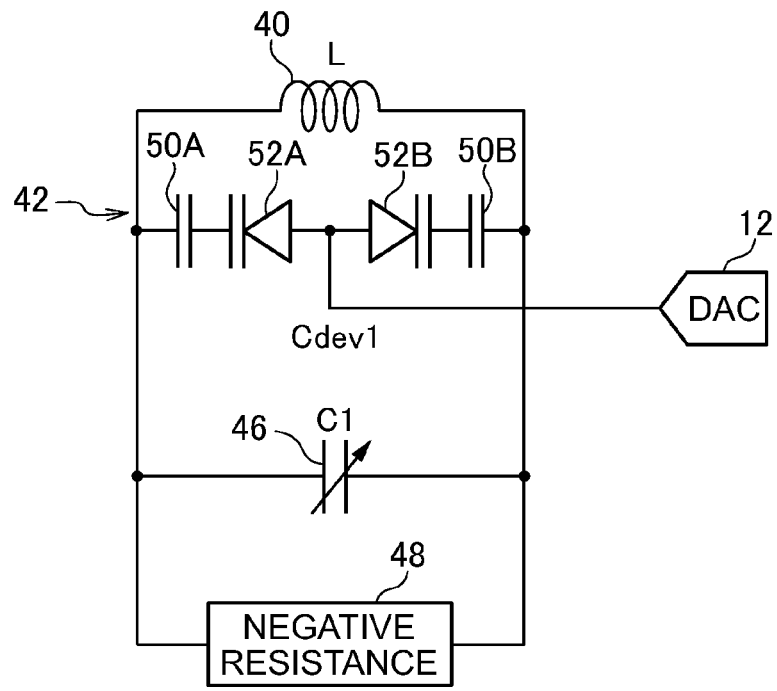
FIG. 16 is a structural diagram of the voltage-controlled oscillator relating to the ninth embodiment.
Figure 17:
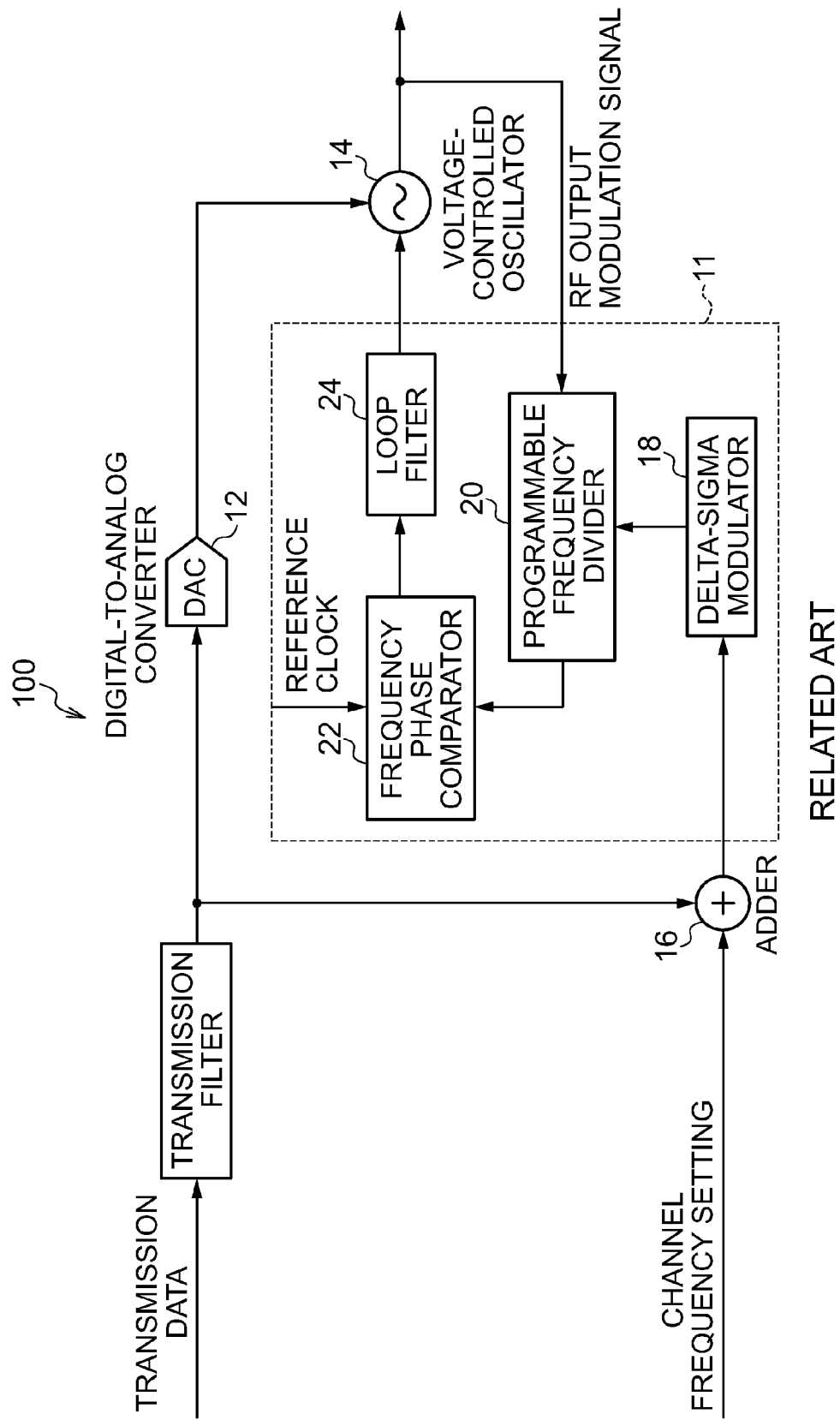
FIG. 17 is a structural diagram of a frequency synthesizer device relating to a related art example.
Figure 18:
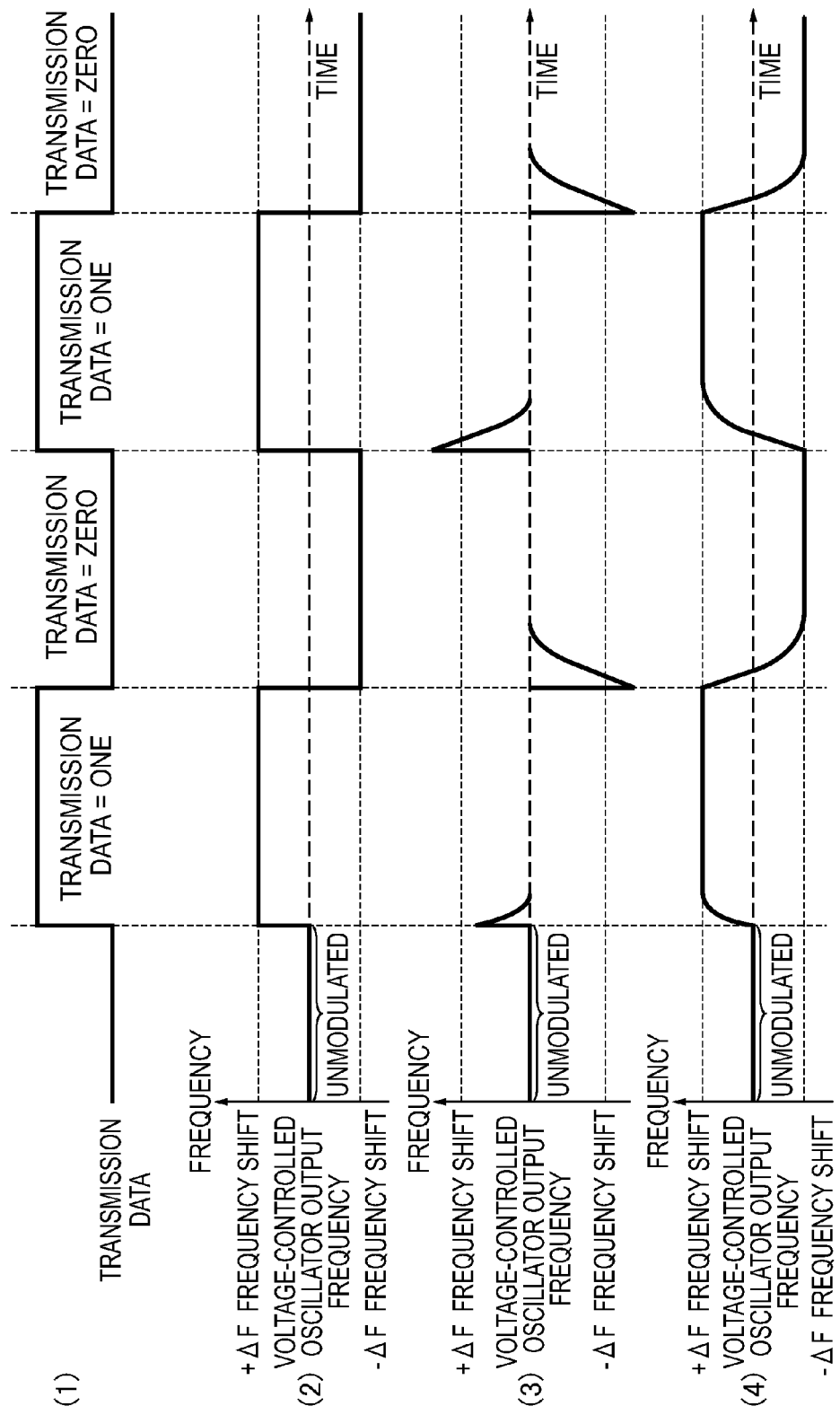
FIG. 18 is a timing chart for describing FSK modulation in a frequency synthesizer device.

Alternatively, as illustrated in FIG. 16, if the inductance of the coil 40 is represented by L, the capacitance of the variable capacitance circuit 42 is represented by Cdev1, the capacitance of the variable capacitance circuit 46 is represented by C1 and the channel frequency (modulation frequency) is represented by F1, the following expression applies.

$$F1 = 1/(2\pi \cdot sqrt(L(C1 + Cdev1))) \quad (2)$$

If frequency displacements of these two frequencies are represented by fdev, the following expressions apply.

$$F0 - fdev = 1/(2\pi \cdot sqrt(L(C0Cdev0))) \quad (3)$$

$$F1 - fdev = 1/(2\pi \cdot sqrt(L(C1 + Cdev1))) \quad (4)$$

From the above expressions (1) to (4), a relationship between Cdev1 and Cdev0 is approximately represented by the following expression. It is assumed here that fdev is much smaller than F0 and F1.

$$Cdev1 = (F0/F1)^2 \times Cdev0 \quad (5)$$

Cdev0 is determined by the output voltage of the DAC 12. Using a region in which the capacitance variation is linear with respect to the output voltage of the DAC 12, Cdev0 is represented by the following expression, using the output voltage Vdac0 of the DAC 12.

$$Cdev0 = A \times Vdac0 \quad (6)$$

Here, A represents a proportionality constant.

From the above expressions (5) and (6), the capacitance Cdev0 of the variable capacitance circuit 42 at the channel frequency F1 is represented by the following expression.

$$Cdev1 = (F0/F1)^2 \times A \times Vdac0 \quad (7)$$

From the above expression (7), an adjustment voltage Vdac1 of the DAC 12 that is required for this modulation frequency displacement at the channel frequency F1 is represented by the following expression.

$$Vdac1 = (F0/F1)^2 \times Vdac0 \quad (8)$$

From the above expression (8), if the DAC adjustment value of the DAC 12 for a particular channel frequency is found, DAC adjustment values for other channel frequencies may be calculated. Therefore, there is no need to execute the processing illustrated in FIG. 3 for each channel frequency. Consequently, DAC adjustment values for respective channel frequencies may be specified in a short duration.

In the above embodiments, configurations are described in which the delta-sigma modulator 18 is provided at the fractional-N frequency synthesizer 11. However, as long as the frequency division ratio may be varied, the delta-sigma modulator 18 is not a limitation.

What is claimed is:

1. A frequency synthesizer device comprising:
a voltage-controlled oscillation unit that oscillates at an oscillation frequency in accordance with an inputted control voltage;
a frequency division unit that frequency-divides an output signal from the voltage-controlled oscillation unit, a frequency division ratio thereof being variable on the basis of an inputted frequency setting signal;
a frequency phase comparison unit that outputs a phase difference, between a frequency-divided signal that has been frequency-divided by the frequency division unit and a reference clock, to the voltage-controlled oscillation unit as the control voltage;
an adjustment voltage output unit that outputs transmission data to the voltage-controlled oscillation unit and that outputs an adjustment voltage to the voltage-controlled oscillation unit when the oscillation frequency is to be displaced by an amount corresponding to a target frequency displacement in accordance with the transmission data;
a switch that, at a time of correction of the adjustment voltage, switches from connecting between the voltage-controlled oscillation unit and the frequency phase comparison unit to connecting between the voltage-controlled oscillation unit and a reference voltage power source that supplies a pre-specified reference voltage; and
a specification unit that, at the time of correction of the adjustment voltage, specifies adjustment data that corresponds to the adjustment voltage corresponding to the target frequency displacement, on the basis of a count value for which a frequency of the frequency-divided signal is counted in a state in which arbitrary transmission data is outputted to the adjustment voltage output unit and causes the voltage-controlled oscillation unit to oscillate, wherein the frequency division unit includes
    a first frequency division unit that frequency-divides the output signal from the voltage-controlled oscillation unit with a pre-specified fixed frequency division ratio, and
    a second frequency division unit that frequency-divides the frequency-divided signal that has been frequency-divided by the first frequency division unit with a frequency division ratio based on the frequency setting signal and outputs an output signal to the frequency phase comparison unit,
    and the specification unit counts the frequency of either the frequency-divided signal from the first frequency division unit or the frequency-divided signal from the second frequency division unit.

2. The frequency synthesizer device according to claim 1, wherein the specification unit specifies the adjustment voltage corresponding to the target frequency displacement on the basis of a difference between two count values of
    a count value when a transmission data one is outputted to the adjustment voltage output unit,
    a count value when a transmission data zero is outputted to the adjustment voltage output unit, or
    a count value when no transmission data is outputted to the adjustment voltage output unit and there is no modulation.

3. The frequency synthesizer device according to claim 2, wherein the specification unit specifies the adjustment voltage corresponding to the target frequency displacement on the basis of a difference between the count value when a transmission data one is outputted to the adjustment voltage output unit and the count value when a transmission data zero is outputted to the adjustment voltage output unit.

4. The frequency synthesizer device according to claim 1 wherein, at the time of correction of the adjustment voltage, the specification unit starts a count of the frequency of the frequency-divided signal after a pre-specified frequency instability period has passed after the switch is connected to the reference voltage power source.

5. The frequency synthesizer device according to claim 1 wherein, at the time of correction of the adjustment voltage, the specification unit re-counts the frequency if the count value is a value outside a pre-specified tolerance range.

6. The frequency synthesizer device according to claim 1, wherein the specification unit obtains an adjustment voltage that corresponds to a frequency displacement that is N times the target frequency displacement, and specifies an adjustment voltage of 1/N of the obtained adjustment voltage as the adjustment voltage corresponding to the target frequency displacement.

7. The frequency synthesizer device according to claim 1, wherein the specification unit, on the basis of the adjustment voltage specified for a pre-specified oscillation frequency, specifies an adjustment voltage for an oscillation frequency that differs from the pre-specified oscillation frequency.

8. A frequency synthesizer device comprising:
a voltage-controlled oscillation unit that oscillates at an oscillation frequency in accordance with an inputted control voltage;
a frequency division unit that frequency-divides an output signal from the voltage-controlled oscillation unit, a frequency division ratio thereof being variable on the basis of an inputted frequency setting signal;
a frequency phase comparison unit that outputs a phase difference, between a frequency-divided signal that has been frequency-divided by the frequency division unit and a reference clock, to the voltage-controlled oscillation unit as the control voltage;
an adjustment voltage output unit that outputs transmission data to the voltage-controlled oscillation unit and that outputs an adjustment voltage to the voltage-controlled oscillation unit when the oscillation frequency is to be displaced by an amount corresponding to a target frequency displacement in accordance with the transmission data;
a switch that, at a time of correction of the adjustment voltage, switches from connecting between the voltage-controlled oscillation unit and the frequency phase comparison unit to connecting between the voltage-controlled oscillation unit and a reference voltage power source that supplies a pre-specified reference voltage; and
a specification unit that, at the time of correction of the adjustment voltage, specifies adjustment data that corresponds to the adjustment voltage corresponding to the target frequency displacement, on the basis of a count value for which a frequency of the frequency-divided signal is counted in a state in which arbitrary transmission data is outputted to the adjustment voltage output unit and causes the voltage-controlled oscillation unit to oscillate, wherein the specification unit specifies, for each bit of the adjustment data, a frequency count period for when specifying the each bit of the adjustment data, based on a weighting for frequency displacement of the each bit of the adjustment data, such that the smaller the weighting for frequency displacement for a bit of the adjustment data, the longer the frequency count period corresponding to said bit of adjustment data.

9. A frequency synthesizer device comprising:
a voltage-controlled oscillation unit that oscillates at an oscillation frequency in accordance with an inputted control voltage;
a frequency division unit that frequency-divides an output signal from the voltage-controlled oscillation unit, a frequency division ratio thereof being variable on the basis of an inputted frequency setting signal;
a frequency phase comparison unit that outputs a phase difference, between a frequency-divided signal that has been frequency-divided by the frequency division unit and a reference clock, to the voltage-controlled oscillation unit as the control voltage;
an adjustment voltage output unit that outputs transmission data to the voltage-controlled oscillation unit and that outputs an adjustment voltage to the voltage-controlled oscillation unit when the oscillation frequency is to be displaced by an amount corresponding to a target frequency displacement in accordance with the transmission data;
a switch that, at a time of correction of the adjustment voltage, switches from connecting between the voltage-controlled oscillation unit and the frequency phase comparison unit to connecting between the voltage-controlled oscillation unit and a reference voltage power source that supplies a pre-specified reference voltage; and
a specification unit that, at the time of correction of the adjustment voltage, specifies adjustment data that corresponds to the adjustment voltage corresponding to the target frequency displacement, on the basis of a count value for which a frequency of the frequency-divided signal is counted in a state in which arbitrary transmission data is outputted to the adjustment voltage output unit and causes the voltage-controlled oscillation unit to oscillate, wherein a frequency corresponding to a pre-specified bit of the adjustment data is counted when the adjustment voltage corresponding to the pre-specified bit of the adjustment data is outputted to the adjustment voltage output unit and the specification unit specifies the adjustment data on the basis of a weighting for frequency displacement of each bit of the adjustment data and the frequency count value for the pre-specified bit of the adjustment data.

10. A frequency synthesizer device comprising:
a voltage-controlled oscillation unit that oscillates at an oscillation frequency in accordance with an inputted control voltage;
a frequency division unit that frequency-divides an output signal from the voltage-controlled oscillation unit, a frequency division ratio thereof being variable on the basis of an inputted frequency setting signal;
a frequency phase comparison unit that outputs a phase difference, between a frequency-divided signal that has been frequency-divided by the frequency division unit and a reference clock, to the voltage-controlled oscillation unit as the control voltage;
an adjustment voltage output unit that outputs transmission data to the voltage-controlled oscillation unit and that outputs an adjustment voltage to the voltage-controlled oscillation unit when the oscillation frequency is to be displaced by an amount corresponding to a target frequency displacement in accordance with the transmission data;
a switch that, at a time of correction of the adjustment voltage, switches from connecting between the voltage-controlled oscillation unit and the frequency phase comparison unit to connecting between the voltage-controlled oscillation unit and a reference voltage power source that supplies a pre-specified reference voltage; and
a specification unit that, at the time of correction of the adjustment voltage, specifies adjustment data that corresponds to the adjustment voltage corresponding to the target frequency displacement, on the basis of a count value for which a frequency of the frequency-divided signal is counted in a state in which arbitrary transmission data is outputted to the adjustment voltage output unit and causes the voltage-controlled oscillation unit to oscillate, wherein the voltage-controlled oscillation unit includes
two variable capacitance circuits that differ in voltage sensitivity, and
a selection unit that, at the time of correction of the adjustment voltage, selects the variable capacitance circuit with the smaller voltage sensitivity from the two variable capacitance circuits and connects the selected variable capacitance circuit to the frequency phase comparison unit, or wherein the voltage-controlled oscillation unit includes
a plurality of variable capacitance circuits connected in parallel, and
a selection unit that, at the time of correction of the adjustment voltage, connects a variable capacitance circuit selected from the plurality of variable capacitance circuits to the adjustment voltage output unit.

11. The frequency synthesizer device according to claim 10, wherein respective capacitance values of the plurality of variable capacitance circuits are specified to be in ratios that are powers of two.

12. A frequency displacement adjustment method comprising:
oscillating at an oscillation frequency in accordance with an inputted control voltage;
frequency-dividing a signal oscillated at the oscillation frequency with a frequency division ratio that is variable on the basis of an inputted frequency setting signal;
outputting a phase difference between a frequency-divided signal that has been frequency-divided and a reference clock to a voltage-controlled oscillation unit as the control voltage, the voltage-controlled oscillation unit oscillating at the oscillation frequency;
outputting transmission data to the voltage-controlled oscillation unit, and outputting an adjustment voltage to the voltage-controlled oscillation unit when the oscillation frequency is to be displaced by an amount corresponding to a target frequency displacement in accordance with the transmission data;
at a time of correction of the adjustment voltage, switching from connecting between the voltage-controlled oscillation unit and a frequency phase comparison unit, which compares the phases of the frequency-divided signal and the reference clock, to connecting between the voltage-controlled oscillation unit and a reference voltage power source that supplies a pre-specified reference voltage; and
at the time of correction of the adjustment voltage, specifying adjustment data that corresponds to the adjustment voltage corresponding to the target frequency displacement, on the basis of a count value for which a frequency of the frequency-divided signal is counted in a state in which arbitrary transmission data is outputted to an adjustment voltage output unit, which outputs the adjustment voltage, and causes the voltage-controlled oscillation unit to oscillate, wherein the frequency dividing comprises first frequency-dividing the output signal from the voltage-controlled oscillation unit with a pre-specified fixed frequency division ratio, and second frequency dividing the frequency-divided signal that has been first frequency-divided with a frequency division ratio based on the frequency setting signal, and
the adjustment data is specified on the basis of a count value of the frequency of either the first frequency-divided signal or the second frequency divided signal.

13. The frequency synthesizer device according to claim 10, wherein the specification unit specifies the adjustment voltage corresponding to the target frequency displacement on the basis of a difference between two count values of
a count value when a transmission data one is outputted to the adjustment voltage output unit,
a count value when a transmission data zero is outputted to the adjustment voltage output unit, or
a count value when no transmission data is outputted to the adjustment voltage output unit and there is no modulation.

14. The frequency synthesizer device according to claim 13, wherein the specification unit specifies the adjustment voltage corresponding to the target frequency displacement on the basis of a difference between the count value when a transmission data one is outputted to the adjustment voltage output unit and the count value when a transmission data zero is outputted to the adjustment voltage output unit.

15. The frequency synthesizer device according to claim 10, wherein, at the time of correction of the adjustment voltage, the specification unit starts a count of the frequency of the frequency-divided signal after a pre-specified frequency instability period has passed after the switch is connected to the reference voltage power source.

16. The frequency synthesizer device according to claim 10 wherein, at the time of correction of the adjustment voltage, the specification unit re-counts the frequency if the count value is a value outside a pre-specified tolerance range.

17. The frequency synthesizer device according to claim 10, wherein the specification unit obtains an adjustment voltage that corresponds to a frequency displacement that is N times the target frequency displacement, and specifies an adjustment voltage of 1/N of the obtained adjustment voltage as the adjustment voltage corresponding to the target frequency displacement.

18. The frequency synthesizer device according to claim 10, wherein the specification unit, on the basis of the adjustment voltage specified for a pre-specified oscillation frequency, specifies an adjustment voltage for an oscillation frequency that differs from the pre-specified oscillation frequency.

19. A frequency displacement adjustment method comprising:
   oscillating at an oscillation frequency in accordance with an inputted control voltage;
   frequency-dividing a signal oscillated at the oscillation frequency with a frequency division ratio that is variable on the basis of an inputted frequency setting signal;
   outputting a phase difference between a frequency-divided signal that has been frequency-divided and a reference clock to a voltage-controlled oscillation unit as the control voltage, the voltage-controlled oscillation unit oscillating at the oscillation frequency;
   outputting transmission data to the voltage-controlled oscillation unit, and outputting an adjustment voltage to the voltage-controlled oscillation unit when the oscillation frequency is to be displaced by an amount corresponding to a target frequency displacement in accordance with the transmission data;
   at a time of correction of the adjustment voltage, switching from connecting between the voltage-controlled oscillation unit and a frequency phase comparison unit, which compares the phases of the frequency-divided signal and the reference clock, to connecting between the voltage-controlled oscillation unit and a reference voltage power source that supplies a pre-specified reference voltage; and
   at the time of correction of the adjustment voltage, specifying adjustment data that corresponds to the adjustment voltage corresponding to the target frequency displacement, on the basis of a count value for which a frequency of the frequency-divided signal is counted in a state in which arbitrary transmission data is outputted to an adjustment voltage output unit, which outputs the adjustment voltage, and causes the voltage-controlled oscillation unit to oscillate,
   wherein the voltage-controlled oscillation unit includes
      two variable capacitance circuits that differ in voltage sensitivity, and
      a selection unit that, at the time of correction of the adjustment voltage, selects the variable capacitance circuit with the smaller voltage sensitivity from the two variable capacitance circuits and connects the selected variable capacitance circuit to the frequency phase comparison unit, or
   wherein the voltage-controlled oscillation unit includes
      a plurality of variable capacitance circuits connected in parallel, and
      a selection unit that, at the time of correction of the adjustment voltage, connects a variable capacitance circuit selected from the plurality of variable capacitance circuits to the adjustment voltage output unit.

* * * * *